(12) United States Patent  
Fujiishi

(10) Patent No.: US 6,743,693 B2  
(45) Date of Patent: Jun. 1, 2004

(54) METHOD OF MANUFACTURING SEMICONDUCTOR MEMORY

(75) Inventor: Yoshitaka Fujiishi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/301,698

(22) Filed: Nov. 22, 2002

(65) Prior Publication Data

US 2003/0232483 A1 Dec. 18, 2003

(30) Foreign Application Priority Data

Jun. 18, 2002 (JP) ........................................ 2002-176662

(51) Int. Cl.[7] .............................................. H01L 21/20
(52) U.S. Cl. .................................... 438/386; 438/243
(58) Field of Search ................................. 438/241, 239, 438/242, 243, 197, 253, 381, 386, 396, 926

(56) References Cited

U.S. PATENT DOCUMENTS

| | | | |
|---|---|---|---|
| 5,279,983 A | 1/1994 | Ahn | ........................... 438/396 |
| 5,386,382 A | 1/1995 | Ahn | ........................... 365/174 |
| 6,455,889 B2 * | 9/2002 | Sakui | ........................... 257/316 |
| 6,501,138 B1 * | 12/2002 | Karasawa | ........................... 257/371 |
| 6,583,005 B2 * | 6/2003 | Hashimoto et al. | ......... 438/241 |

FOREIGN PATENT DOCUMENTS

JP 7-7084 1/1995

* cited by examiner

*Primary Examiner*—David Nhu  
(74) *Attorney, Agent, or Firm*—Oblon, Spivak, McClelland, Maier & Neustadt, P.C.

(57) ABSTRACT

A photomask includes patterns corresponding to openings, a pattern corresponding to a trench and dummy patterns not to be transferred to a photoresist. The patterns are arranged in a matrix at a second pitch in the column direction and at a first pitch in the row direction. The dummy patterns are spaced at the second pitch from the most adjacent ones of the patterns aligned in the row direction, and the dummy patterns are spaced at a first pitch from the most adjacent ones of the patterns aligned in the column direction. Using such photomask, openings on each of which a lower electrode of a capacitor is to be formed are formed in an insulation layer in a memory cell array forming region, and the trench is formed in the insulation layer at the border between the memory cell array forming region and a peripheral circuit forming region.

20 Claims, 33 Drawing Sheets

METHOD OF MANUFACTURING SEMICONDUCTOR MEMORY

BACKGROUND OF THE INVENTION

1. Field of the Invention

The present invention relates to a method of manufacturing a semiconductor memory including a memory cell array and a peripheral circuit thereof.

2. Description of the Background Art

FIGS. 26 and 29 to 33 are sectional views showing a background method of manufacturing a semiconductor memory in sequential order. The semiconductor memory includes a region in which a memory cell array is formed (hereinafter referred to as "memory cell array forming region") and a region in which a peripheral circuit of the memory cell array is formed (hereinafter referred to as "peripheral circuit forming region"). A memory cell array constituting a DRAM, for example, is formed in the memory cell array forming region, and a peripheral circuit including a sense amplifier, a sub-decoder and the like is formed in the peripheral circuit forming region. Referring to FIGS. 26 and 29 to 33, the background method of manufacturing the semiconductor memory will be described.

As shown in FIG. 26, a plurality of bit lines 103 are formed in the memory cell array forming region, and a bit line 106 is formed in the peripheral circuit forming region adjacent to the memory cell array forming region. Then, an insulation layer 118 is formed in the memory cell array forming region and peripheral circuit forming region to cover the bit lines 103 and 106. The insulation layer 118 is made of a silicon oxide film, for example.

Next, a plurality of storage node contact plugs (hereinafter referred to as "SC plugs") 107 are provided in the insulation layer 118 in the memory cell array forming region. The SC plugs 107 have top surfaces exposed from the insulation layer 118 and are arranged in a matrix in the direction perpendicular to the film thickness direction of the insulation layer 118. The SC plugs 107 are made of doped polysilicon or metal, for example.

The bit lines 103 each have a stacked structure of a conductive film 101 made of doped polysilicon, metal or the like and a silicon nitride film 102. The bit line 106 also has a stacked structure of a conductive film 104 made of doped polysilicon, metal or the like and a silicon nitride film 105, similarly to the bit lines 103.

Although not shown, a semiconductor substrate provided with a plurality of semiconductor elements is present under the insulation layer 118. A plurality of MOS transistors are formed in a matrix on the semiconductor substrate in the memory cell array forming region while a transistor which constitutes the peripheral circuit is formed in the semiconductor substrate in the peripheral circuit forming region. The SC contact plugs 107 are each provided for each of the MOS transistors formed on the semiconductor substrate and electrically connected to one of source/drain regions of each MOS transistor. The bit lines 103 and 106 are electrically connected to the other source/drain region of each MOS transistor to which no SC plug 107 is connected.

Next, a silicon nitride film 108 and an insulation layer 109 made of, e.g., a silicon oxide film are stacked in this order on the upper surfaces of the insulation layer 118 and the SC plugs 107. Accordingly, the silicon nitride film 108 and insulation layer 109 are provided in the memory cell array forming region and peripheral circuit forming region. Then, a photoresist (not shown) is formed over the insulation layer 109 and the photoresist is exposed using a photomask (not shown) having a predetermined mask pattern. As a result, the mask pattern of the photomask is transferred to the photoresist. The photoresist is then developed, and a predetermined opening pattern is formed on the photoresist.

Next, the insulation layer 109 and silicon nitride film 108 are etched using the photoresist having the predetermined opening pattern formed thereon as a mask. Accordingly, a plurality of openings 110 for exposing the SC plugs 107 are formed in the insulation layer 109 and silicon nitride film 108 in the memory cell array forming region, and a trench 120 is further formed in the insulation layer 109 and silicon nitride film 108 at the border between the memory cell array forming region and peripheral circuit forming region. The photomask used for forming the openings 110 and the trench 120 will be described later in detail.

Next, a polysilicon film is entirely formed, part of which is present above the openings 110 and the trench 120 is removed by a CMP method. Accordingly, a lower electrode 111 of a capacitor made of a polysilicon film is formed on the surface of each of the openings 110, and a guard ring film 121 made of a polysilicon film is formed on the surface of the trench 120.

FIG. 27 is a plan view showing the structure of FIG. 26 viewed from an arrow C. FIG. 27 illustrates the SC plugs 107, bit lines 103 and 106 in broken lines which actually do not appear in the plan view. FIG. 26 is a sectional view taken along the line D—D of FIG. 27.

As shown in FIG. 27, the openings 110 are each provided for each of the SC plugs 107 and arranged in a matrix in the direction perpendicular to the film thickness direction of the insulation layer 109. Specifically, the openings 110 are arranged at a pitch P200 in the column direction and at a pitch P100 in the row direction.

The trench 120 is formed to surround the openings 110. Part of the trench 120 extending in the column direction is spaced at a pitch P101 from the most adjacent ones of the openings 110 aligned in the column direction, while part of the trench 120 extending in the row direction is spaced at a pitch P201 from the most adjacent ones of the openings 110 aligned in the row direction. The "column direction" and "row direction" denote the left-to-right direction and top-to-bottom direction of the drawing sheet, respectively.

FIG. 28 is a plan view showing a photomask 300 used for forming the openings 110 and the trench 120 shown in FIG. 27. The photomask 300 is a positive-type photoresist, for example.

As shown in FIG. 28, the photomask 300 is provided with a mask pattern 301 including a plurality of patterns 200 corresponding to the openings 110 and a pattern 201 corresponding to the trench 120. The patterns 200 are arranged in a matrix at a pitch P210 in the column direction and at a pitch P110 in the row direction.

The pattern 201 is formed to surround the patterns 200. Part of the pattern 201 extending in the column direction is spaced at a pitch P111 from the most adjacent ones of the patterns 200 aligned in the column direction, while part of the pattern 201 extending in the row direction is spaced at a pitch P211 from the most adjacent ones of the patterns 200 aligned in the row direction.

In the case where the mask pattern 301 is transferred to the photoresist on an equal scale, the pitches P110, P111, P210 and P211 correspond to the pitches P100, P101, P200 and P201 shown in FIG. 27, respectively. In the case where the mask pattern 301 is transferred to the photoresist on a reduced scale, e.g., on a one-fifth scale, the pitches P110, P111, P210 and P211 are five times the pitches P100, P101, P200 and P201 shown in FIG. 27, respectively.

Next, as shown in FIG. 29, a resist 130 is formed on the insulation layer 109 and guard ring film 121 in the peripheral circuit forming region. Accordingly, the trench 120 is filled with the resist 130. Then, as shown in FIG. 30, the insulation layer 109 is selectively etched using the resist 130 as a mask to remove the insulation layer 109 in the memory cell array forming region. As shown in FIG. 31, the resist 130 is then removed.

Next, as shown in FIG. 32, a dielectric film 112 of a capacitor is formed on the lower electrode 111, guard ring film 121 and silicon nitride film 108 in the memory cell array forming region, and an upper electrode 113 of the capacitor is formed on the dielectric film 112. Accordingly, a plurality of capacitors 115 are formed in the memory cell array forming region. An insulation layer 140 made of, e.g., a silicon oxide film is formed over the insulation layer 109 and upper electrode 113.

Next, as shown in FIG. 33, a contact plug 157 is formed in the insulation layers 109, 118 and 140 and silicon nitride films 105 and 108 in the peripheral circuit forming region to be in contact with the conductive film 104 of the bit line 106. The contact plug 157 is made of, e.g., tungsten having its upper surface exposed from the insulation layer 140.

A metal wire 150 is formed on the insulation layer 140 to be in contact with the contact plug 157. A metal wire 151 electrically insulated from the metal wire 150 is further formed on the insulation layer 140. The metal wires 150 and 151 are made of, e.g., aluminum.

With the above-described steps, the memory cell array constituting the DRAM is formed in the memory cell array forming region and the peripheral circuit of the memory cell array is formed in the peripheral circuit forming region.

With the aforementioned background method of manufacturing the semiconductor memory, isotropic etching is usually performed using fluoric acid or the like when performing the step shown in FIG. 30, that is, when masking the peripheral circuit forming region and selectively removing the insulation layer 109 in the memory cell array forming region. Thus, fluoric acid may be impregnated into the insulation layer 109 in the masked peripheral circuit forming region in the case where the guard ring film 121 is not provided unlike the aforementioned background method of manufacturing the semiconductor memory, which may cause the insulation layer 109 in the peripheral circuit forming region to be also removed. This may create a step height on the upper surface of the upper insulation layer 140, causing defocus and the like in a photolithography process for forming the metal wires 150 and 151 on the insulation layer 140. As a result, it has been difficult to form the metal wires 150 and 151 in a desired shape.

With the above-described method, however, the guard ring film 121 is formed at the border between the memory cell array forming region and peripheral circuit forming region, preventing fluoric acid or the like from being impregnated into the insulation layer 109 in the peripheral circuit forming region as shown in FIG. 26, which prevents the insulation layer 109 in the peripheral circuit forming region from being removed. As a result, a step height is prevented from appearing on the upper surface of the upper insulation layer 140, making easier to form the metal wires 150 and 151 in a desired shape.

A technique of preventing a step height on the upper insulation layer by providing the above-described guard ring film 121 at the border between the memory cell array forming region and peripheral circuit forming region is disclosed in Japanese Patent Application Laid-Open No. 7-7084.

With the above-described method, however, the outermost ones of the openings 110 arranged in a matrix may be formed in a size greatly different from a desired size unlike the rest of the openings 110 in the case where the pitch of the patterns 200 and that between the pattern 201 and the most adjacent ones of the patterns 200 are not in agreement with each other in the mask pattern 301. This will be described below in detail.

As shown in FIG. 28, the patterns 200 corresponding to the openings 110 are arranged at the pitch P210 in the column direction and at the pitch P110 in the row direction. When transferring such patterns arranged at predetermined pitches to a photoresist, exposing conditions are usually adjusted in accordance with pitches of patterns to be transferred, i.e., the pitches P110 and P210 in this case. In other words, when transferring patterns arranged with periodicity to a photoresist, exposing conditions are adjusted in accordance with the periodicity of the patterns to be transferred. Therefore, the patterns can be transferred to a photoresist with reliability even if they are minute patterns.

However, in the case where the pitch P111 between part of the pattern 201 extending in the column direction and the most adjacent ones of the patterns 200 aligned in the column direction is not in agreement with the pitch P110 of the patterns 200 in the row direction, the periodicity in the row direction is broken. This may cause the most adjacent ones of the patterns 200 in the column direction spaced from the pattern 201 at the pitch P111 to be transferred to a photoresist in a size greatly different from a desired size.

Further, in the case where the pitch P211 between part of the pattern 201 extending in the row direction and the most adjacent ones of the patterns 200 aligned in the row direction is not in agreement with the pitch P210 of the patterns 200 in the column direction, the periodicity in the column direction is broken. This may cause the most adjacent ones of the patterns 200 in the row direction spaced from the pattern 201 at the pitch P211 to be transferred to a photoresist in a size greatly different from a desired size.

As described, depending on the relationship between the pattern 201 and patterns 200, the outermost ones of the patterns 200 arranged in a matrix may be transferred to a photoresist in a size greatly different from a desired size unlike the rest of the patterns 200. Thus, when forming the openings 110 using the developed photoresist as a mask, the outermost ones of the openings 110 arranged in a matrix may be formed in a size greatly different from a desired size.

For instance, when the pitch P111 shown in FIG. 28 is smaller than the pitch P110, the outermost ones of the patterns 200 aligned in the column direction are transferred to the photoresist in a size greater than a desired size. Thus, the outermost ones of the openings 110 aligned in the column direction are formed in a size greater than a desired size. When the pitch P211 shown in FIG. 28 is smaller than the pitch P210, the outermost ones of the patterns 200 aligned in the row direction are transferred to the photoresist in a size greater than a desired size. Thus, the outermost ones of the openings 110 aligned in the row direction are formed in a size greater than a desired size. In this manner, when the openings 110 are formed in a size greater than a desired size, adjacent ones of the openings 110 may communicate with each other, and lower electrodes 111 may be short-circuited between adjacent ones of the capacitors 150. This may reduce the reliability of a semiconductor memory.

Further, when the pitch P111 shown in FIG. 28 is greater than the pitch P110, for instance, the outermost ones of the patterns 200 aligned in the column direction are transferred to the photoresist in a size smaller than a desired size. Thus, the outermost ones of the openings 110 aligned in the column direction are formed in a size smaller than a desired size. When the pitch P211 shown in FIG. 28 is greater than the pitch P210, the outermost ones of the patterns 200 aligned in the row direction are transferred to the photoresist in a size smaller than a desired size. Thus, the outermost ones of the openings 110 aligned in the row direction are formed in a size smaller than a desired size. In this manner, when the openings 110 are formed in a size smaller than a desired size, the surface area of the lower electrode 111 formed on each of the openings 110 may not be ensured sufficiently, resulting in a reduction in capacity of the capacitors 115.

Furthermore, when the openings 110 are formed in a size smaller than a desired size, the contact area of the lower electrode 111 and the SC plugs 107 and silicon nitride film 108 is reduced, causing the lower electrode 111 to easily fall down after the insulation layer 109 in the memory cell array forming region is removed. This may cause so-called "pattern discontinuity" in which the lower electrode 111 falls down after the step shown in FIG. 26 is performed.

As described above, a semiconductor memory may be degraded in reliability even when the openings 110 are formed in a size smaller than a desired size.

Further, as shown in FIG. 27, the trench 120 is formed linearly in the column and row directions, so that the guard ring film 121 formed on the surface of the trench 120 also extends linearly. Thus, the guard ring film 121 easily falls down in the direction perpendicular to the extending direction thereof after the step shown in FIG. 30 is performed. Specifically, as shown in FIG. 30, a sidewall of the guard ring film 121 in the peripheral circuit forming region is supported by the insulation layer 109, whereas there is nothing provided to support the other sidewall of the guard ring film 121 in the memory cell array forming region, causing the guard ring film 121 to easily fall down to the side of the memory cell array forming region. This may cause a drawback in the reliability of the semiconductor memory.

SUMMARY OF THE INVENTION

An object of the present invention is to provide a technique of improving a semiconductor memory in reliability.

A first aspect of the present invention is directed to a method of manufacturing a semiconductor memory including a memory cell array forming region and a peripheral circuit forming region adjacent to the memory cell array forming region. The method includes the following steps (a) through (e). The step (a) is to form an insulation layer in the memory cell array forming region and the peripheral circuit forming region. The step (b) is to form a plurality of openings in the insulation layer in the memory cell array forming region and forming a trench in the insulation layer at the border between the memory cell array forming region and the peripheral circuit forming region. The step (c) is to form a lower electrode of a capacitor on a surface of each of the plurality of openings. The step (d), after the step (c), is to fill the trench with a resist and form the resist on the insulation layer in the peripheral circuit forming region. The step (e) is to selectively etch the insulation layer using the resist as a mask. The step (b) includes the following steps (b-1) through (b-5). The step (b-1) is to prepare a photomask provided with a mask pattern including a plurality of first patterns corresponding to the plurality of openings, arranged at a predetermined pitch, a first dummy pattern aligned linearly with the plurality of first patterns at the predetermined pitch from the most adjacent one of the plurality of first patterns, and a second pattern corresponding to the trench. The step (b-2) is to form a photoresist on the insulation layer. The step (b-3) is to expose the photoresist using the photomask to transfer the mask pattern to the photoresist. The step (b-4) is to developing the photoresist, after the step (b-3). The step (b-5) is to etch the insulation layer using the photoresist as a mask to form the plurality of openings and the trench, after the step (b-4). The first dummy pattern is not transferred to the photoresist in the step (b-3).

Since the first dummy pattern is provided and spaced from the plurality of first patterns corresponding to the plurality of openings at the same pitch as that of the plurality of first patterns, the periodicity is maintained in the arrangement direction of the plurality of first patterns. This allows the outermost ones of the plurality of first patterns spaced at a predetermined pitch from the first dummy pattern to be transferred to the photoresist without significantly deviating from a desired size. Therefore, the outermost one of the plurality of openings can be formed close to a desired shape. As a result, the occurrence of pattern discontinuity and the like can be suppressed, which improves the semiconductor memory in reliability.

Further, the trench is formed at the border between the memory cell array forming region and peripheral circuit forming region, and the resist fills the trench. Thus, the insulation layer in the peripheral circuit forming region as masked is not etched when the step (e) is performed.

A second aspect of the present invention is directed to a method of manufacturing a semiconductor memory including a memory cell array forming region and a peripheral circuit forming region adjacent to the memory cell array forming region. The method includes the following steps (a) through (e). The step (a) is to form an insulation layer in the memory cell array forming region and the peripheral circuit forming region. The step (b) is to form a plurality of openings in the insulation layer in the memory cell array forming region and forming a trench in the insulation layer at the border between the memory cell array forming region and the peripheral circuit forming region. The step (c) is to form a lower electrode of a capacitor on a surface of each of the plurality of openings and forming a guard ring film on a surface of the trench. The step (d), after the step (c), is to form a resist on the insulation layer in the peripheral circuit forming region. The step (e) is to selectively etch the insulation layer using the resist as a mask. The step (b) includes the following steps (b-1) through (b-5). The step (b-1) is to prepare a photomask provided with a mask pattern including a plurality of first patterns corresponding to the plurality of openings, arranged at a predetermined pitch, a first dummy pattern aligned linearly with the plurality of first patterns at the predetermined pitch from the most adjacent one of the plurality of first patterns and a second pattern corresponding to the trench. The step (b-2) is to form a photoresist on the insulation layer. The step (b-3) is to expose the photoresist using the photomask to transfer the mask pattern to the photoresist. The step (b-4) is to develop the photoresist, after the step (b-3). The step (b-5) is to etch the insulation layer using the photoresist as a mask to form the plurality of openings and the trench, after the step (b-4). The first dummy pattern is not transferred to the photoresist in the step (b-3).

Since the first dummy pattern is provided and spaced from the plurality of first patterns at the same pitch as that of the plurality of first patterns, the periodicity is maintained in the arrangement direction of the plurality of first patterns. Therefore, the outermost one of the plurality of openings can be formed close to a desired shape. As a result, the occurrence of pattern discontinuity and the like can be suppressed, which improves the semiconductor memory in reliability.

Further, the guard ring film is formed at the border between the memory cell array forming region and peripheral circuit forming region. Thus, the insulation layer in the peripheral circuit forming region as masked is not etched when the step (e) is performed.

A third aspect of the present invention is directed to a method of manufacturing a semiconductor memory including a memory cell array forming region and a peripheral circuit forming region adjacent to the memory cell array forming region. The method includes the following steps (a) through (e). The step (a) is to form an insulation layer in the memory cell array forming region and the peripheral circuit forming region. The step (b) is to form an opening in the insulation layer in the memory cell array forming region and forming a meandering trench in the insulation layer at the border between the memory cell array forming region and the peripheral circuit forming region. The step (c) is to form a lower electrode of a capacitor on a surface of the opening and forming a guard ring film on a surface of the trench. The step (d), after the step (c), is to form a resist on the insulation layer in the peripheral circuit forming region. The step (e) is to selectively etch the insulation layer using the resist as a mask.

Since the guard ring film is formed at the border between the memory cell array forming region and peripheral circuit forming region, the insulation layer in the peripheral circuit forming region as masked is not etched when the step (e) is performed.

Further, the trench meanders, and therefore, the guard ring film formed in the trench also meanders. Thus, the guard ring film is unlikely to fall down after the step (e) is performed as compared to the case of forming the guard ring film in a trench that extends linearly. As a result, the semiconductor memory is improved in reliability.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

FIGS. 1 through 8 and 13 through 17 are sectional views showing a method of manufacturing a semiconductor memory according to a first preferred embodiment of the present invention in sequential order. The semiconductor memory according to the present embodiment includes a memory cell array forming region and a peripheral circuit forming region adjacent thereto. A memory cell array constituting a DRAM, for example, is formed in the memory cell array forming region, and a peripheral circuit including a sense amplifier, a sub-decoder and the like is formed in the peripheral circuit forming region. Referring to FIGS. 1 through 8 and 13 through 17, the method of manufacturing the semiconductor memory according to the present embodiment will be described.

Figure 1:
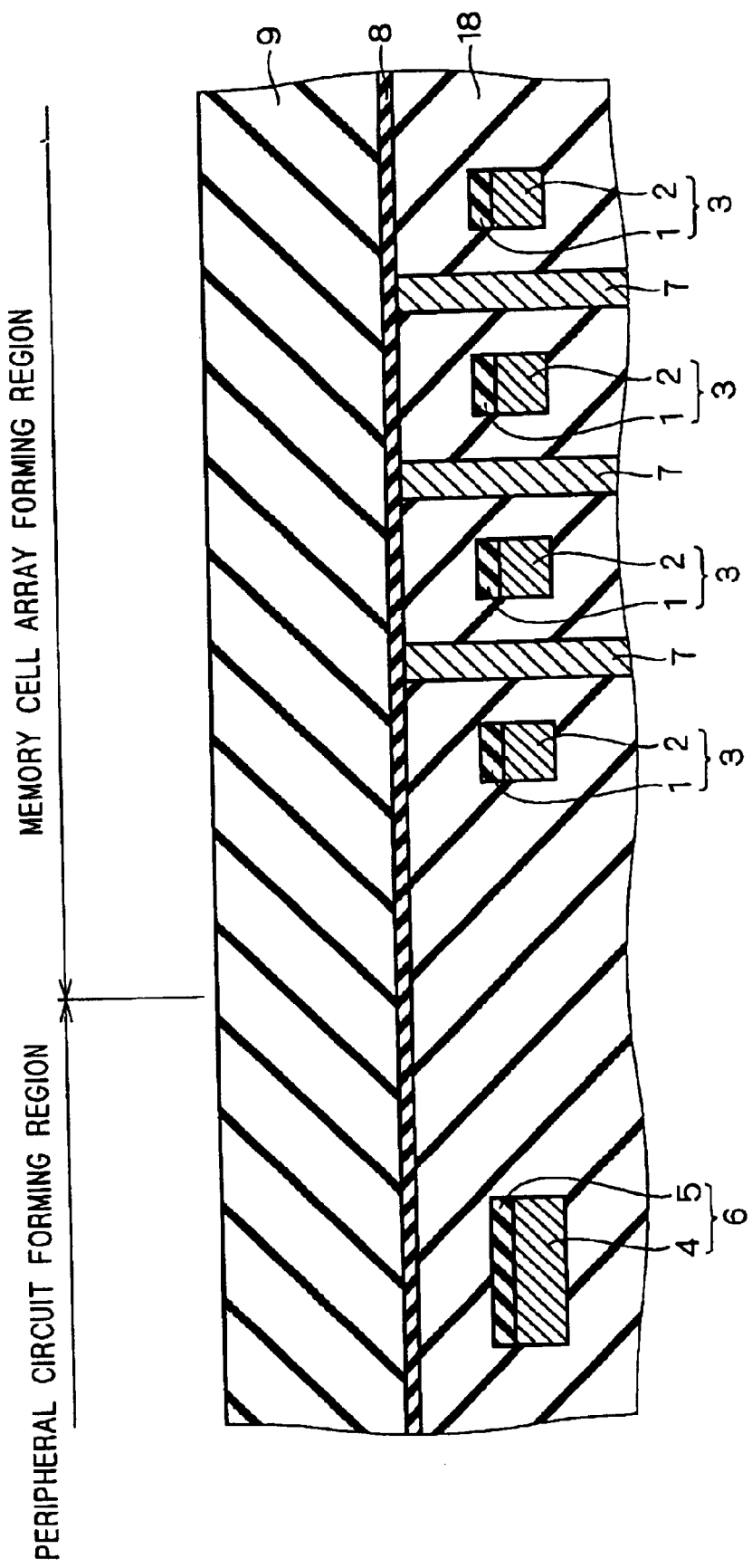
FIGS. 1 through 8 are sectional views showing a method of manufacturing a semiconductor memory according to a first preferred embodiment of the present invention in sequential order.

As shown in FIG. 1, the memory cell array forming region is provided with a plurality of bit lines 3, and the peripheral circuit forming region is provided with a bit line 6. Then, an insulation layer 18 is formed in the memory cell array forming region and peripheral circuit forming region to cover the bit lines 3 and 6. The insulation layer 18 is made of, e.g., a silicon oxide film.

Next, a plurality of SC plugs 7 are formed in the insulation layer 18 in the memory cell array forming region. The SC plugs 7 have top surfaces exposed from the insulation layer 18 and are arranged in a matrix in the direction perpendicular to the film thickness direction of the insulation layer 18. The SC plugs 7 are made of, e.g., doped polysilicon or metal.

The bit lines 3 each have a stacked structure of a conductive film 1 made of doped polysilicon, metal or the like and a silicon nitride film 2. The bit line 6 also has a stacked structure of a conductive film 4 made of doped polysilicon, metal or the like and a silicon nitride film 5, similarly to the bit lines 3.

Although not shown in the drawings, a semiconductor substrate provided with a plurality of semiconductor elements is present under the insulation layer 18. A plurality of MOS transistors constituting a memory cell array are formed in a matrix on the semiconductor substrate in the memory cell array forming region while a transistor constituting a peripheral circuit is formed on the semiconductor substrate in the peripheral circuit forming region. The SC plugs 7 are each provided for each MOS transistor formed on the semiconductor substrate and electrically connected to one of source/drain regions of each MOS transistor. The bit lines 3 and 6 are electrically connected to the other source/drain region of each MOS transistor to which no SC plug 7 is connected.

Figure 2:
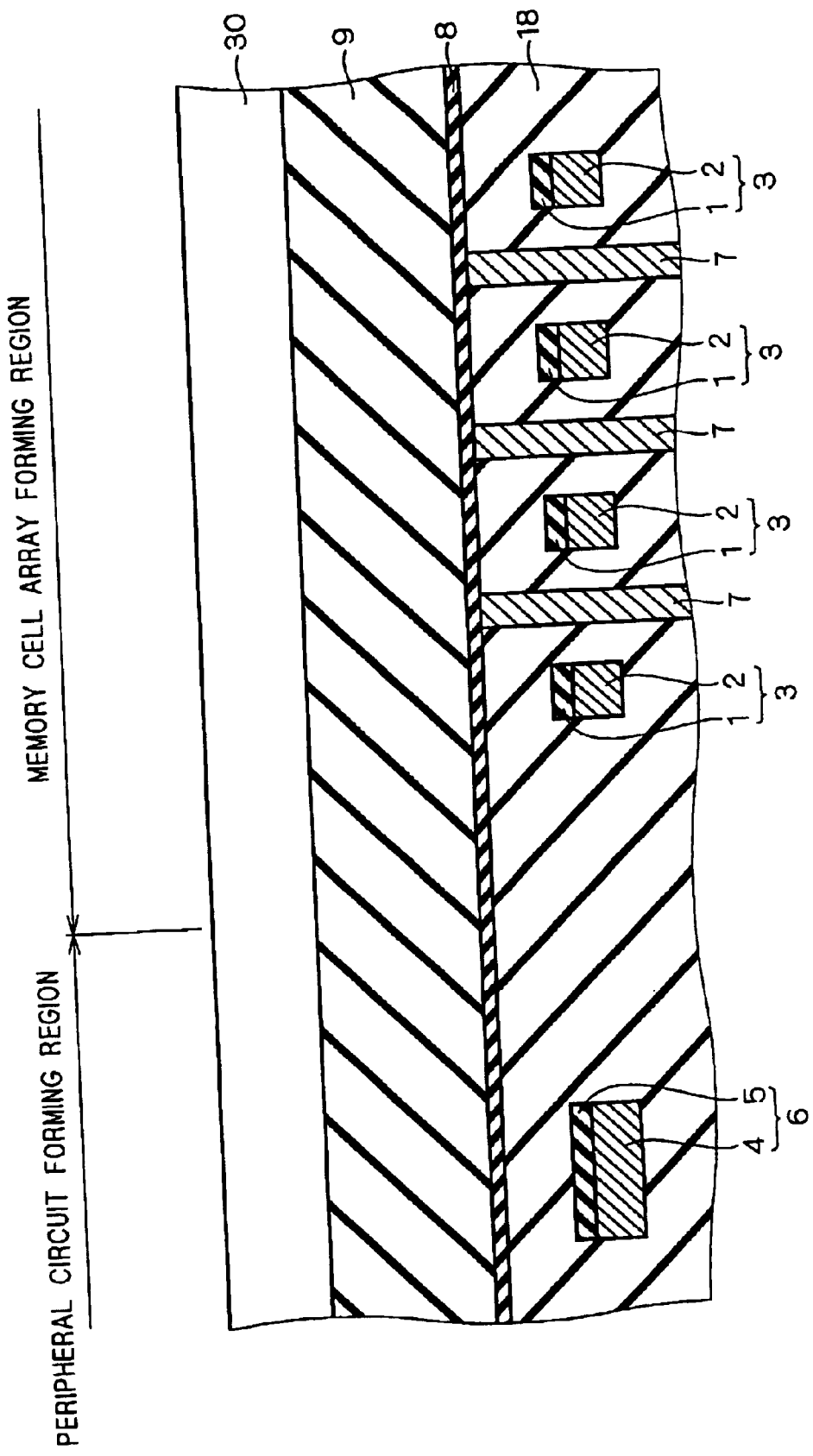

Next, a silicon nitride film 8 and an insulation layer 9 made of, e.g., a silicon oxide film are stacked in this order on the upper surfaces of the insulation layer 18 and the SC plugs 7. Accordingly, the silicon nitride film 8 and insulation layer 9 are provided in the memory cell array forming region and peripheral circuit forming region. Then, a photoresist 30 is formed over the insulation layer 9 as shown in FIG. 2.

Figure 3:
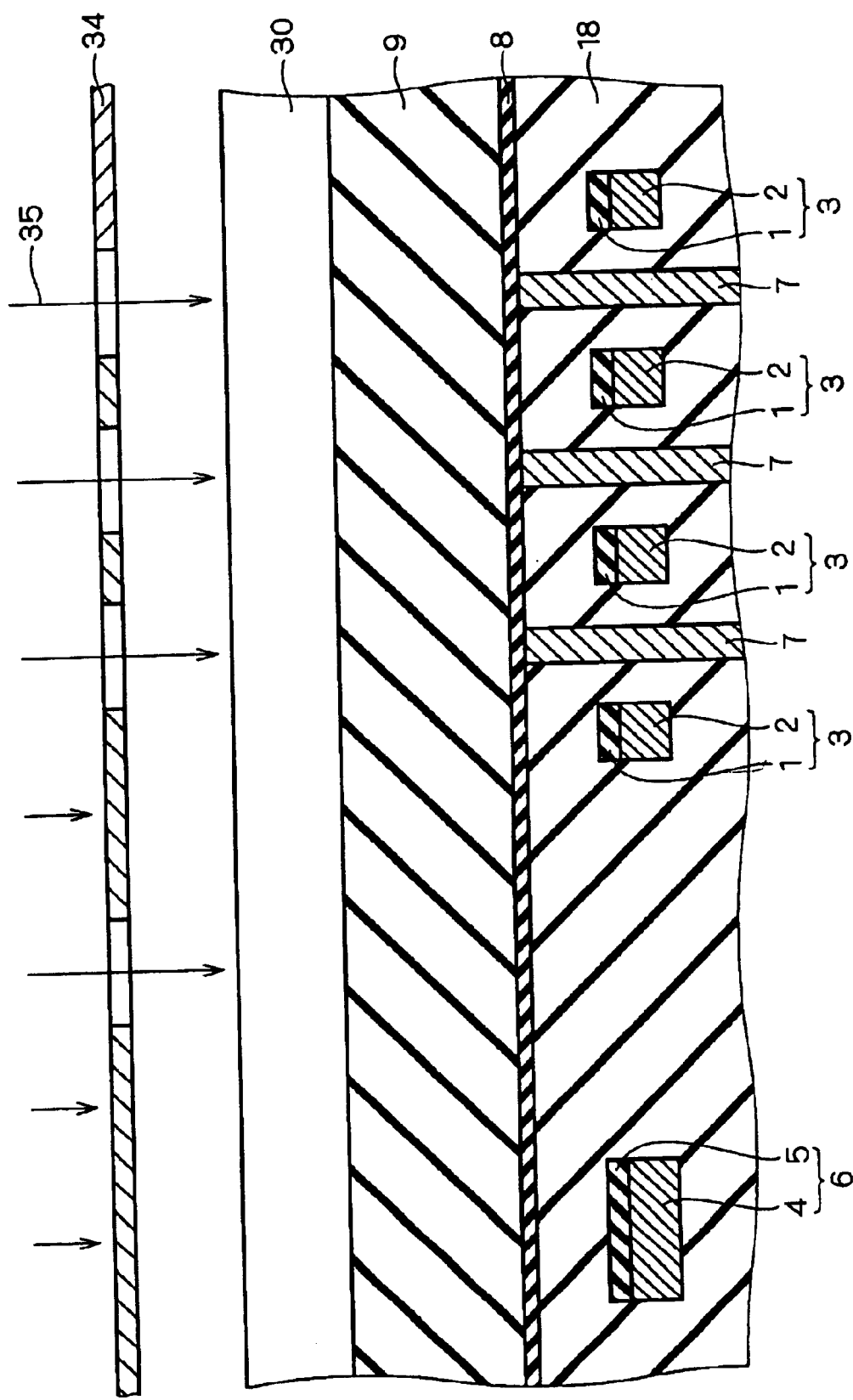

Next, as shown in FIG. 3, the photoresist 30 is exposed using a photomask 34 of a positive type, for example, having a predetermined mask pattern. Accordingly, the mask pattern of the photomask 34 is transferred to the photoresist 30. An arrow 35 shown in FIG. 3 denotes irradiated light used in exposing the photoresist 30.

Figure 4:
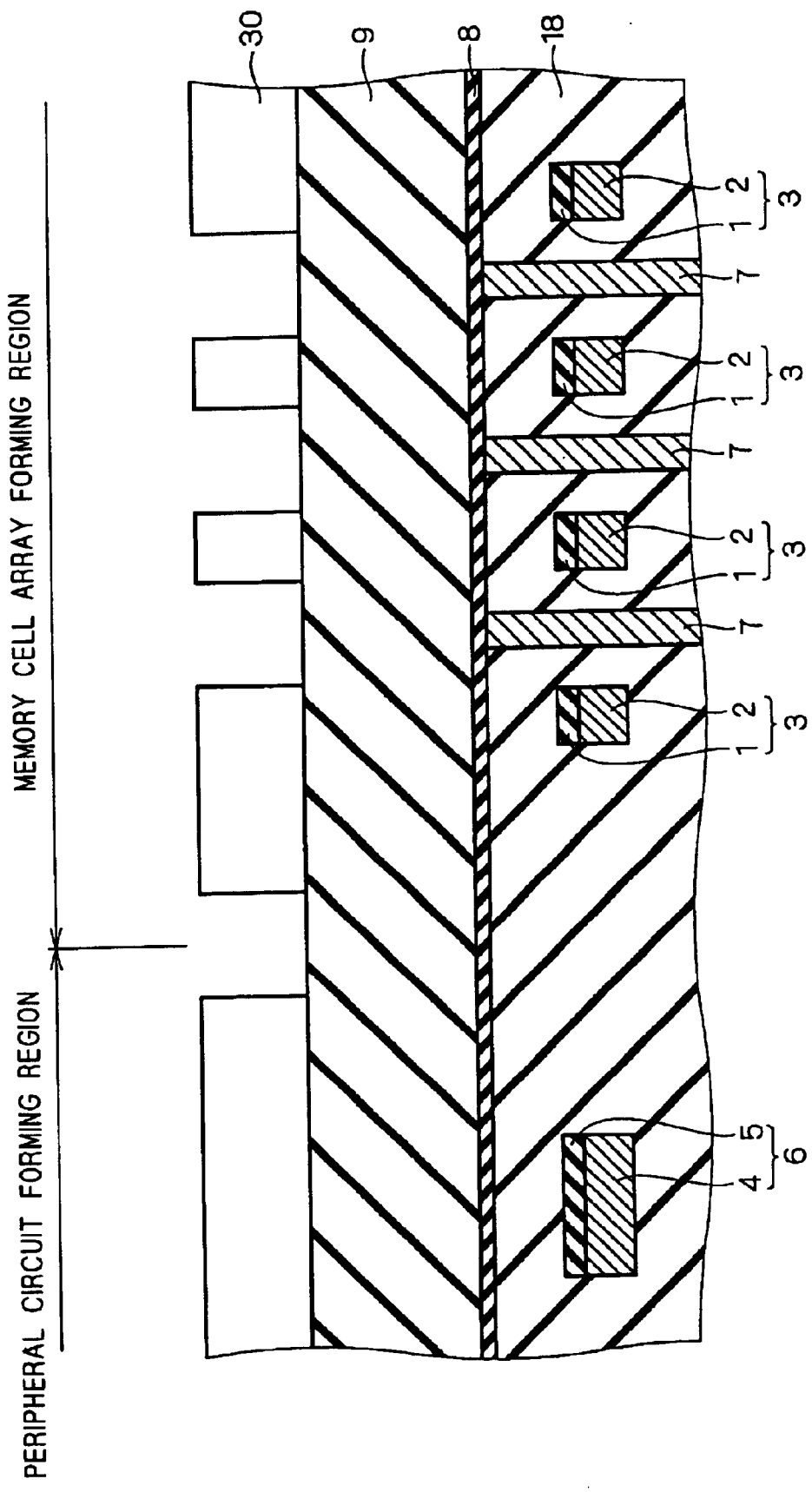
Figure 5:
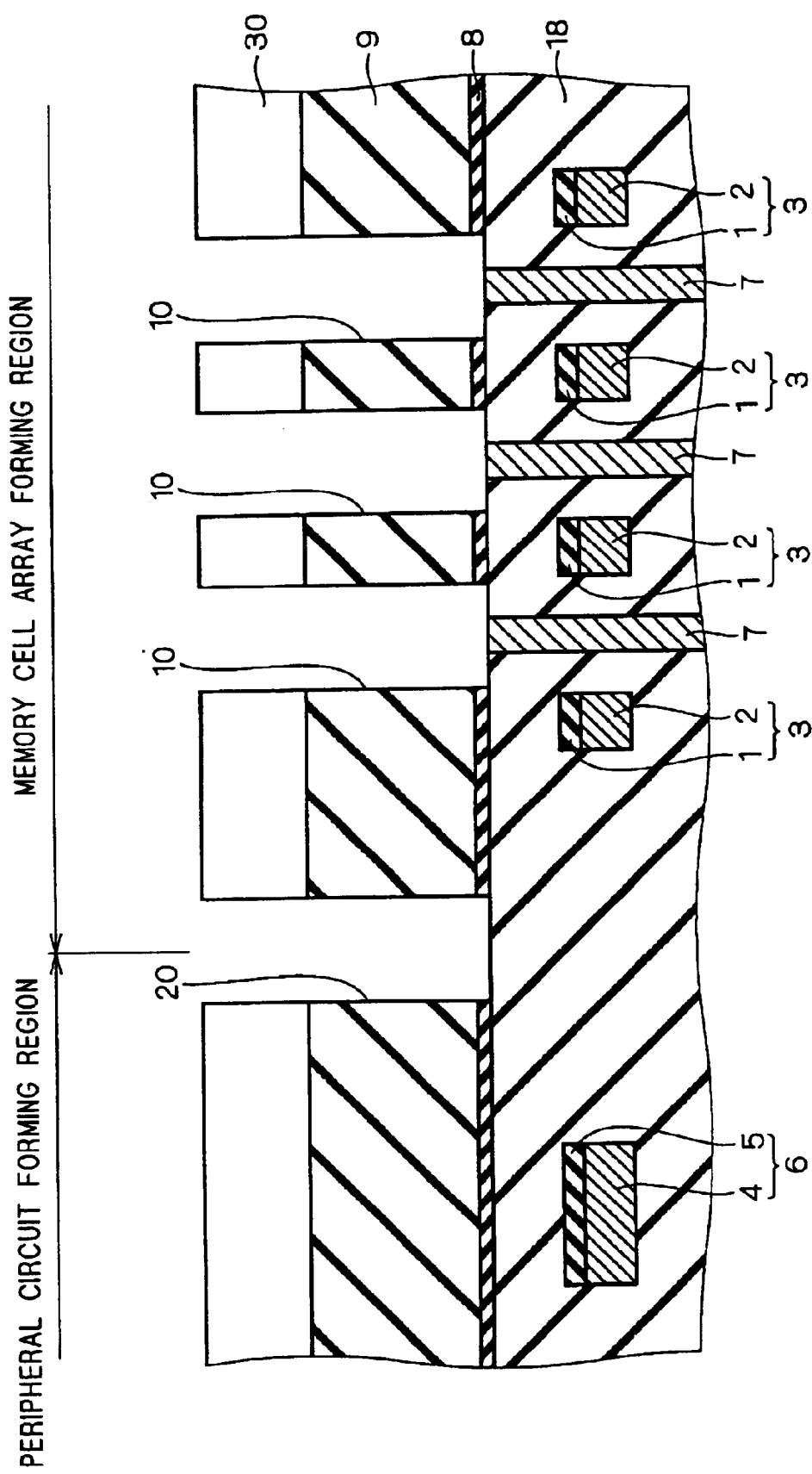

Next, as shown in FIG. 4, the photoresist 30 is developed to form a predetermined opening pattern on the photoresist 30. Next, as shown in FIG. 5, the insulation layer 9 is etched using the photoresist 30 having the predetermined opening pattern as a mask and the silicon nitride film 8 as an etching stopper. Exposed part of the silicon nitride film 8 is then removed by etching. Accordingly, a plurality of openings 10 for exposing the SC plugs 7 are formed in the insulation layer 9 and silicon nitride film 8 in the memory cell array forming region, and a trench 20 is further formed in the insulation layer 9 and silicon nitride film 8 at the border between the memory cell array forming region and peripheral circuit forming region. The photomask 34 used in forming the openings 10 and the trench 20 will be described later in detail.

Figure 6:
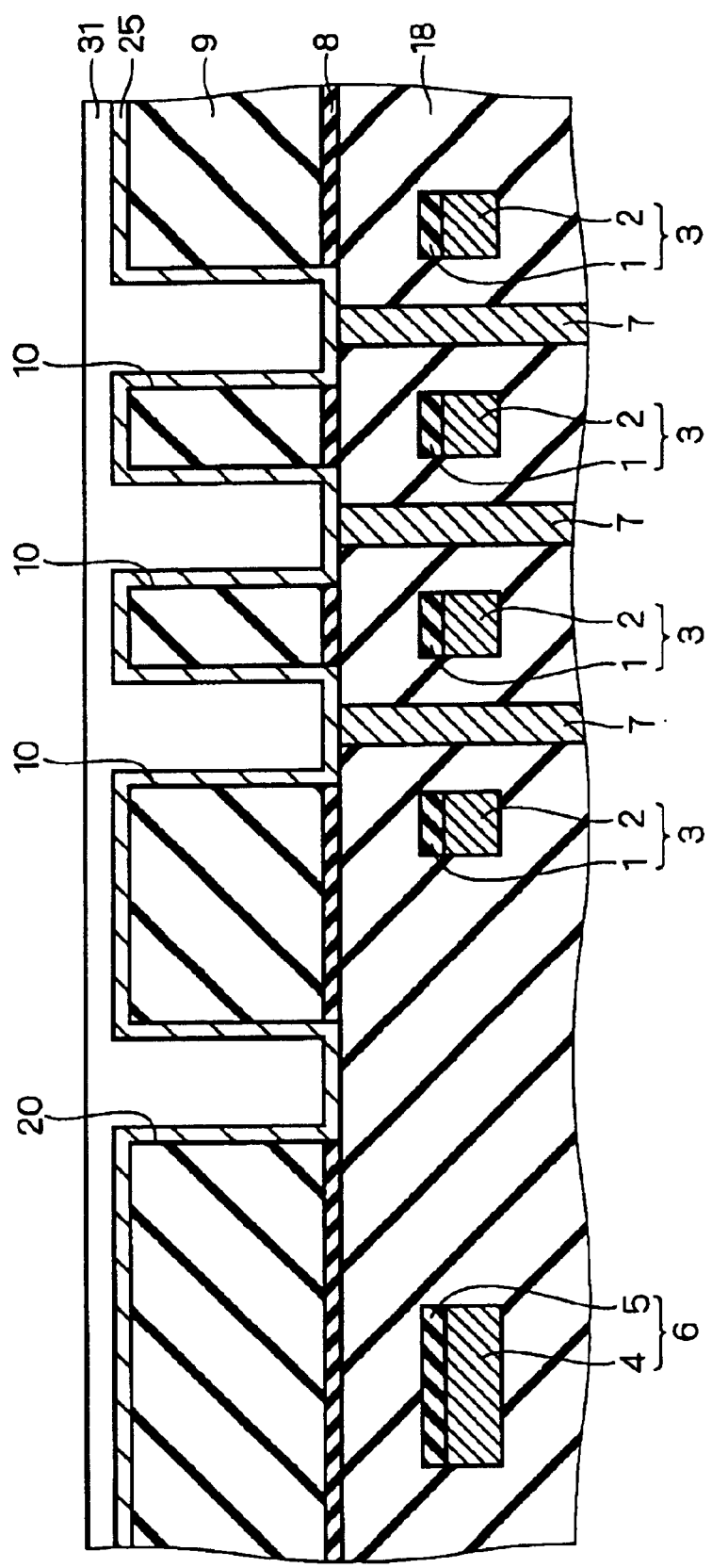
Figure 7:
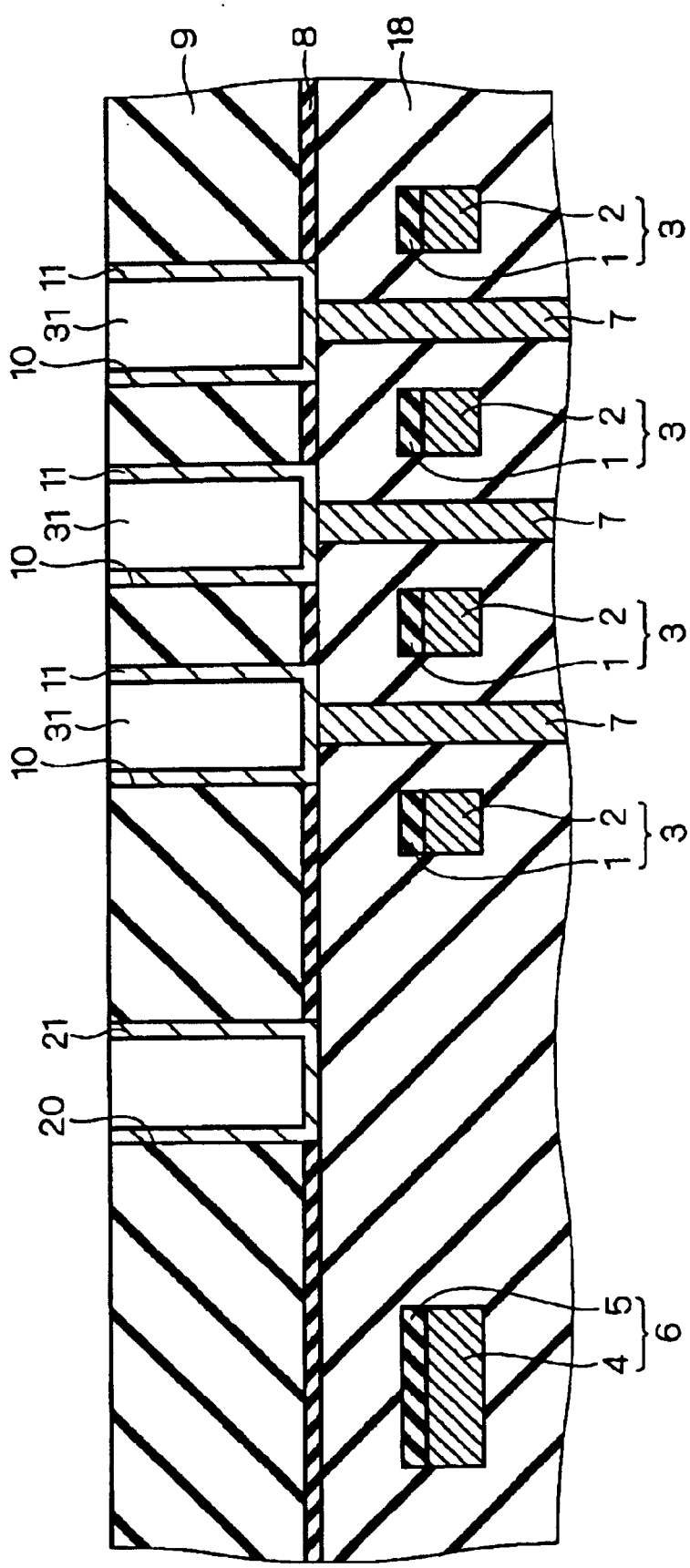

Next, as shown in FIG. 6, a polysilicon film 25 is entirely formed, and a resist 31 is formed on the polysilicon film 25 to fill the openings 10 and the trench 20. Then, as shown in FIG. 7, the structure obtained by the step shown in FIG. 6 is polished from above using a CMP method, thereby removing part of the polysilicon film 25 and the resist 31 present above the openings 10 and the trench 20. Accordingly, a lower electrode 11 of a capacitor constituting a DRAM made of a polysilicon film is formed on the surface of each of the openings 10, and a guard ring film 21 made of a polysilicon film is formed on the surface of the trench 20. Then, as shown in FIG. 8, the resist 31 filling the openings 10 and trench 20 is removed.

Figure 8:
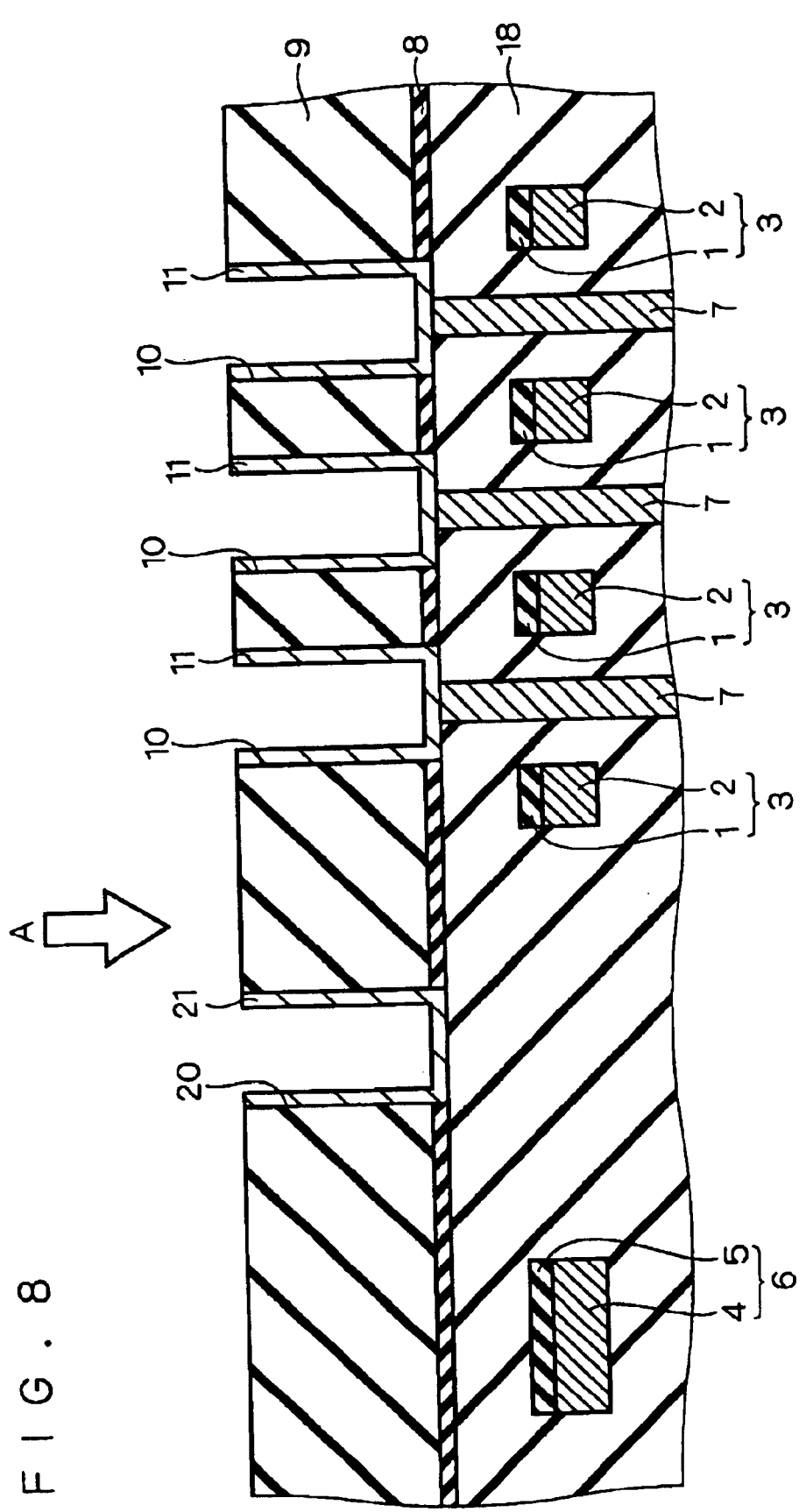
Figure 9:
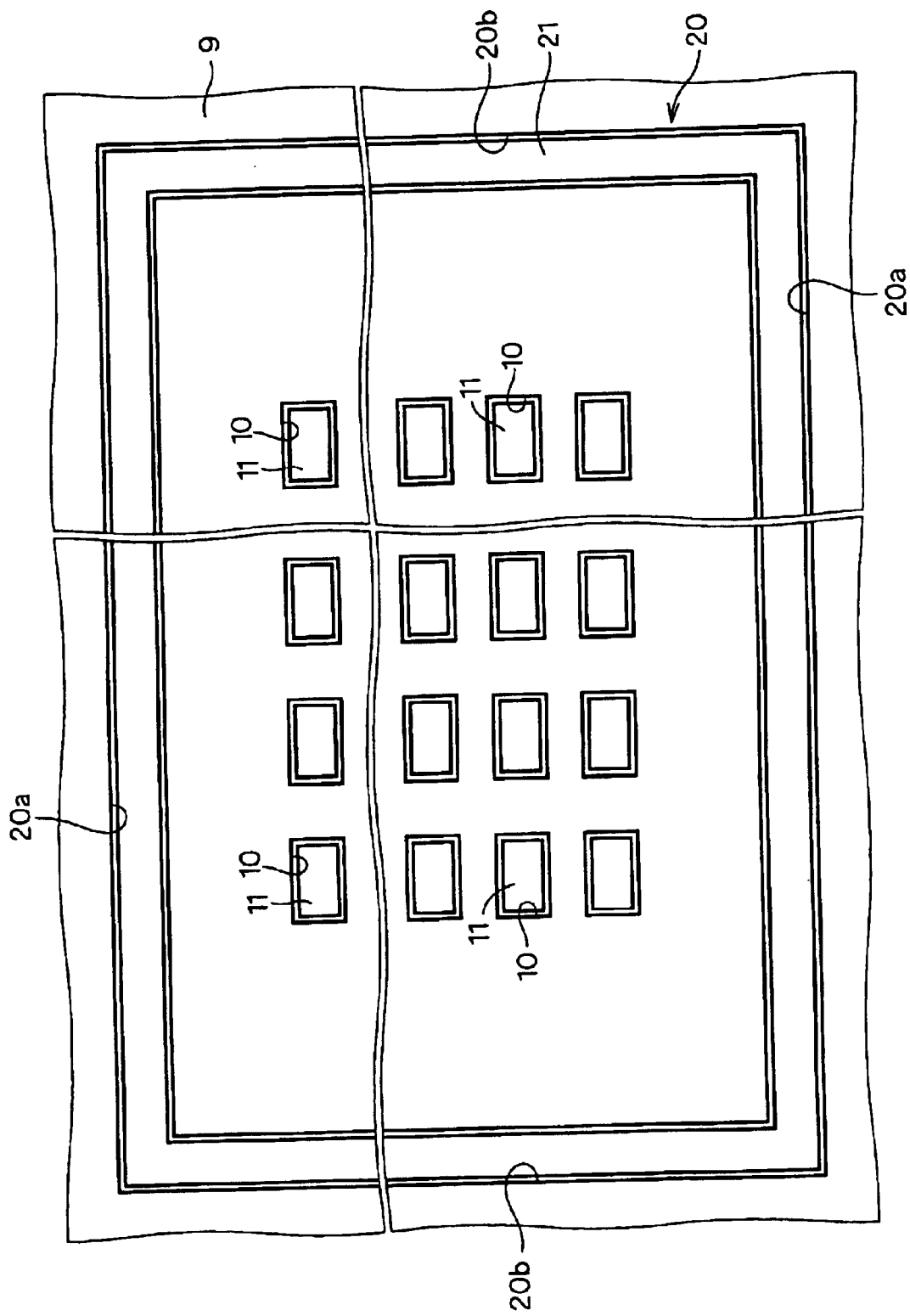
FIGS. 9 and 10 are plan views showing the structure of the semiconductor memory according to the first preferred embodiment.
Figure 10:
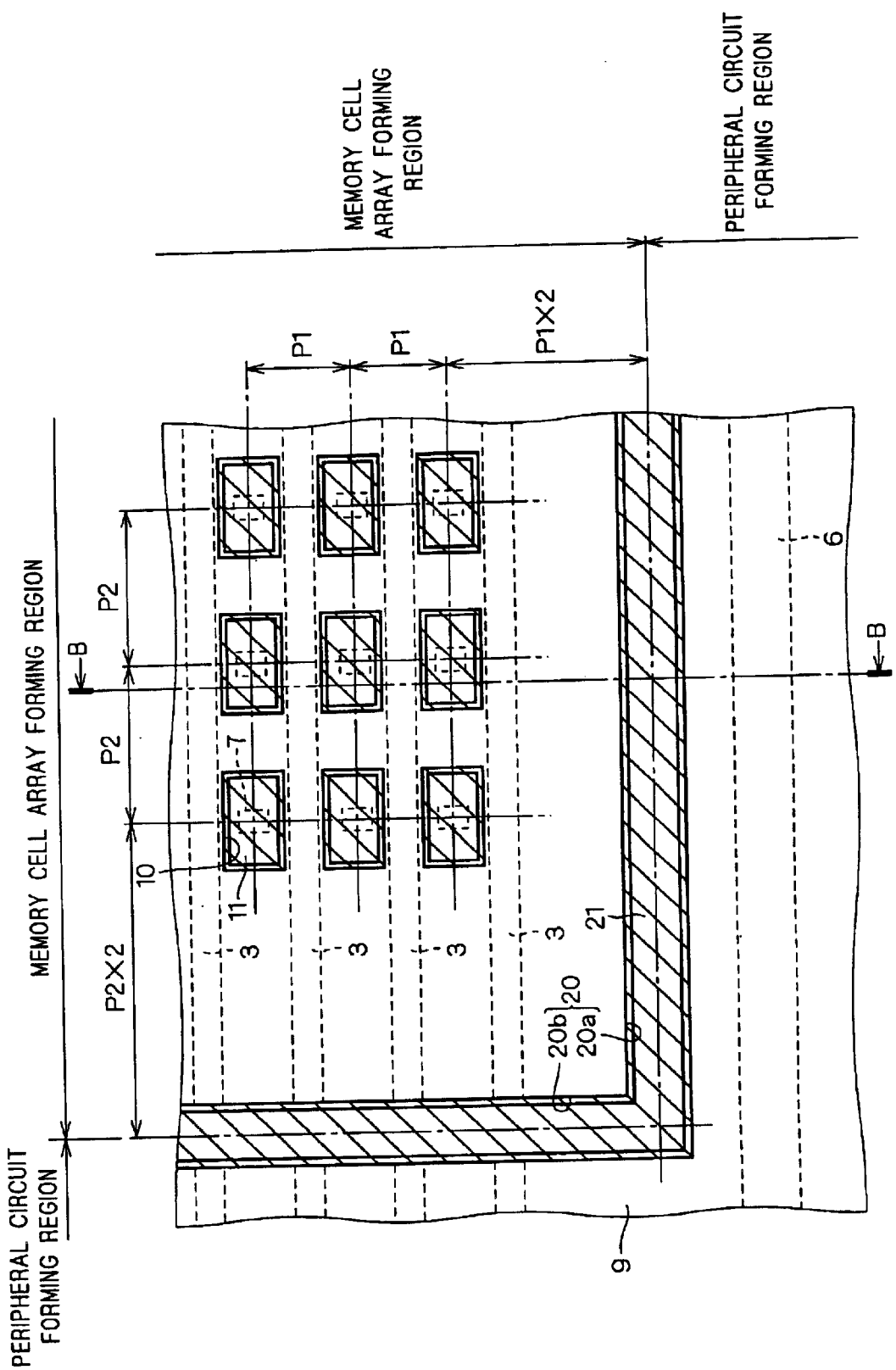

FIGS. 9 and 10 are plan views showing the structure of FIG. 8 viewed from an arrow A. FIG. 10, a partially enlarged view of FIG. 9, illustrates the SC plugs 7, bit lines 3 and 6 in broken lines which actually do not appear in the plan view. FIG. 8 is the sectional view taken along the line B—B of FIG. 10.

As shown in FIGS. 9 and 10, the openings 10 are each provided for each of the SC plugs 7 and arranged in a matrix in the direction perpendicular to the film thickness direction of the insulation layer 9. The openings 10 are arranged at a pitch P2 in the column direction and at a pitch P1 in the row direction. Specifically, the distance between the central axes extending in the row direction of adjacent ones of the openings 10 in the column direction is the pitch P2, and the distance between the central axes extending in the column direction of adjacent ones of the openings 10 in the row direction is the pitch P1.

The trench 20 is formed to surround the openings 10. Specifically, the trench 20 includes a pair of trenches 20a extending in the column direction of the openings 10 and a pair of trenches 20b extending in the row direction of the openings 10. The pair of trenches 20a are spaced at a predetermined pitch with the openings 10 provided therebetween. The pair of trenches 20b are also spaced at a predetermined pitch with the openings 10 provided therebetween. One of the trenches 20a has its one end in the column direction connected with one end of one of the trenches 20b in the row direction and the other end in the column direction connected with one end of the other of the trenches 20b in the row direction. The other of the trenches 20a has its one end in the column direction connected to the other end of the one of the trenches 20b in the row direction and the other end in the column direction connected with the other end of the other of the trenches 20b in the row direction. Accordingly, the trenches 20a and 20b communicate with each other and surround the openings 10.

The central axis of each of the trenches 20a in the column direction is spaced at twice the pitch P1 from the most adjacent ones of the openings 10 aligned in the column direction, while the central axis of each of the trenches 20b in the row direction is spaced at twice the pitch P2 from the most adjacent ones of the openings 10 aligned in the row direction. Specifically, the distance between the central axis extending in the column direction of each of the trenches 20a and that in the column direction of the most adjacent ones of the openings 10 aligned in the column direction is twice the pitch P1, while the distance between the central axis extending in the row direction of each of the trenches 20b and that in the row direction of the most adjacent ones of the openings 10 aligned in the row direction is twice the pitch P2.

Since the peripheral circuit of the semiconductor memory according to the present embodiment is provided to surround the memory cell array, for example, that is, the border between the peripheral circuit forming region and memory cell array forming region surrounds the memory cell array, the trench 20 formed at this border surrounds the openings 10.

Figure 11:
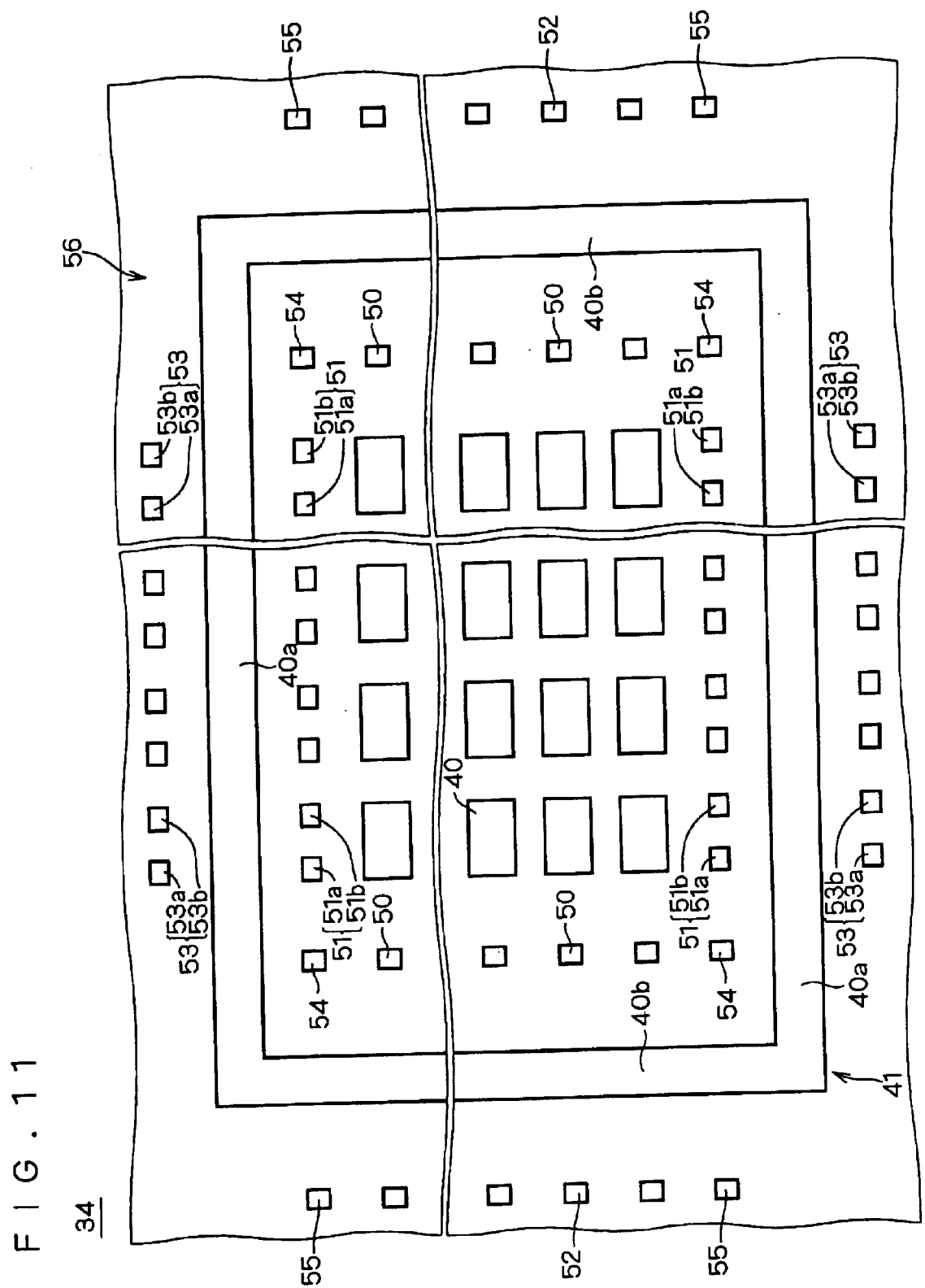
FIGS. 11 and 12 are plan views showing a photomask used in the method of manufacturing the semiconductor memory according to the first preferred embodiment.
Figure 12:
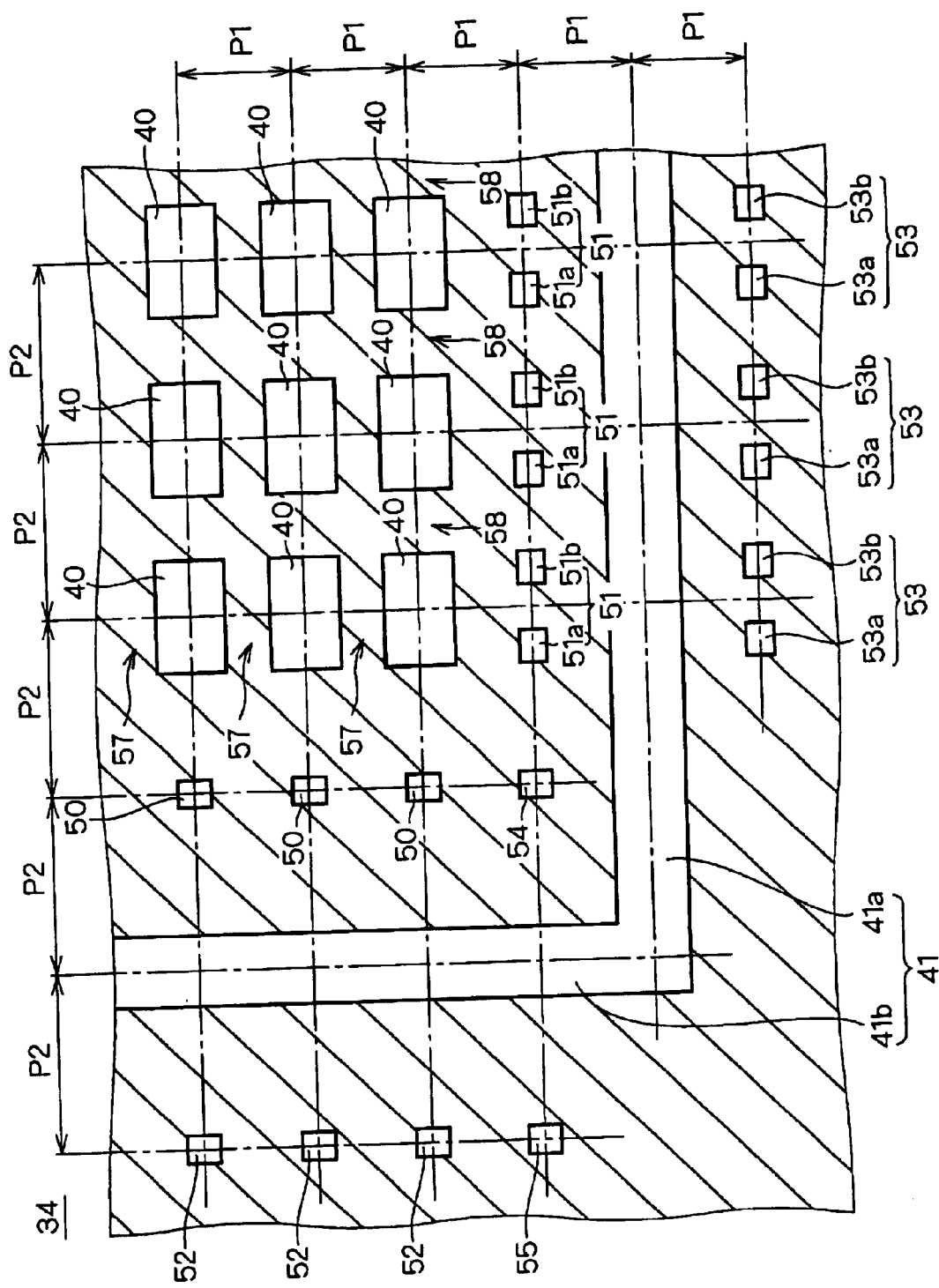

FIGS. 11 and 12 are plan views showing the photomask 34 used in forming the openings 10 and the trench 20 shown in FIGS. 9 and 10. The photomask 34 is used in transferring a mask pattern to a photoresist on an equal scale, for example. FIG. 12 is a partially enlarged view of FIG. 11.

As shown in FIGS. 11 and 12, the photomask 34 is provided with a mask pattern 56 including a plurality of patterns 40 of substantially rectangular shape corresponding to the openings 10, a pattern 41 corresponding to the trench 20 and a plurality of dummy patterns 50 to 55 of substantially rectangular shape which are not transferred to the photoresist.

The patterns 40 are arranged in a matrix at the pitch P2 in the column direction and at the pitch P1 in the row direction. Specifically, the distance between the central axes extending in the row direction of adjacent ones of the patterns 40 in the column direction is the pitch P2, and the distance between the central axes extending in the column direction of adjacent ones of the patterns 40 in the row direction is the pitch P1.

The pattern 41 is formed to surround the patterns 40. Specifically, the pattern 41 includes a pair of patterns 41a corresponding to the pair of trenches 20a and extending in the column direction and a pair of patterns 41b corresponding to the pair of trenches 20b and extending in the row direction. The pair of patterns 41a are spaced at a predetermined pitch with the patterns 40 provided therebetween. The pair of patterns 40b are also spaced at a predetermined pitch with the patterns 40 provided therebetween. One of the patterns 41a has its one end in the column direction connected with one end of one of the patterns 41b in the row direction and the other end in the column direction connected with one end of the other of the patterns 41b in the row direction. The other of the patterns 41a has its one end in the column direction connected with the other end of the one of the patterns 41b in the row direction and the other end in the column direction connected with the other end of the other of the patterns 41b in the row direction. Accordingly, the patterns 41a and 41b are connected with each other and surround the patterns 40. The width of the patterns 41a in the row direction and that of the patterns 41b in the column direction correspond to the width of the patterns 40 in the row direction, for example.

The dummy patterns 50 are provided for each column of the patterns 40 between the one of the patterns 41b and the most adjacent ones of the patterns 40 aligned in the row direction, and are further provided for each column of the patterns 40 between the other of the patterns 41b and the most adjacent ones of the patterns 40 aligned in the row direction. For ease of explanation, those of the dummy patterns 50 provided between the one of the patterns 41b and the most adjacent ones of the patterns 40 aligned in the row direction may hereinafter be called "dummy patterns 50A" and those provided between the other of the patterns 41b and the most adjacent ones of the patterns 40 aligned in the row direction may be called "dummy patterns 50B".

The dummy patterns 50 are each aligned linearly with the patterns 40 aligned in the column direction and spaced at the pitch P2 from the most adjacent one of the patterns 40. Specifically, the distance between the central axis extending in the row direction of the dummy patterns 50 and that in the row direction of the most adjacent ones of the patterns 40 aligned in the row direction is the pitch P2.

Further, the dummy patterns 50 are provided at the pitch P1 in the row direction. Specifically, the distance between the central axes extending in the column direction of adjacent ones of the dummy patterns 50A is the pitch P1, and the distance between the central axes extending in the column direction of adjacent ones of the dummy patterns 50B is the pitch P1.

Furthermore, the dummy patterns 50 are spaced at the pitch P2 from the central axis of the adjacent one of the patterns 41b extending in the row direction. Specifically, the distance between the central axis of the dummy patterns 50A extending in the row direction and that of the one of the patterns 41b extending in the row direction is the pitch P2, while the distance between the central axis of the dummy patterns 50B extending in the row direction and that of the other of the patterns 41b extending in the row direction is the pitch P2.

The dummy patterns 51 are each provided for each row of the patterns 40 between the one of the patterns 41a and the most adjacent ones of the patterns 40 aligned in the column direction, and are further provided for each row of the patterns 40 between the other of the patterns 41a and the most adjacent ones of the patterns 40 aligned in the column direction. For ease of explanation, those of the dummy patterns 51 provided between the one of the patterns 41a and the most adjacent ones of the patterns 40 aligned in the column direction may hereinafter be called "dummy patterns 51A" and those provided between the other of the patterns 41a and the most adjacent ones of the patterns 40 aligned in the column direction may be called "dummy patterns 51B".

The dummy patterns 51 are each aligned linearly with the patterns 40 aligned in the row direction and spaced at the pitch P1 from the most adjacent one of the patterns 40. Specifically, the dummy patterns 51 each include dummy patterns 51a and 51b spaced from each other at a predetermined pitch and aligned in the column direction. When the dummy patterns 51a and 51b are taken as one pattern, each of the dummy patterns 51 is aligned linearly with the patterns 40 aligned in the row direction.

The distance between the central axis of the dummy patterns 51a and 51b extending in the column direction and that in the column direction of the most adjacent ones of the patterns 40 aligned in the column direction is the pitch P1.

The dummy patterns 51 are provided at the pitch P2 in the column direction. Specifically, the distance between the central axes of adjacent ones of the dummy patterns 51A extending in the row direction is the pitch P2, and the distance between the central axes of adjacent ones of the dummy patterns 51B extending in the row direction is the pitch P2. "The central axis of the dummy patterns 51 extending in the row direction" represents the axis at the same distance from the central axis of each of the dummy patterns 51a extending in the row direction and that of a corresponding one of the dummy patterns 51b extending in the row direction.

Further, the dummy patterns 51 are each spaced at the pitch P1 from the central axis of the patterns 41a extending in the column direction. Specifically, the distance between the central axis extending in the column direction of the dummy patterns 51a and 51b of the dummy patterns 51A and that of the one of the patterns 41a extending in the column direction is the pitch P1, while the distance between the central axis extending in the column direction of the dummy patterns 51a and 51b of the dummy patterns 51B and that of the other of the patterns 41b extending in the column direction is the pitch P1.

The dummy patterns 52 are provided on the opposite side of the dummy patterns 50A with respect to the one of the patterns 41b and on the opposite side of the dummy patterns 50B with respect to the other of the patterns 41b. For ease of explanation, those of the dummy patterns 52 provided on the opposite side of the dummy patterns 50A with respect to the one of the patterns 41b may hereinafter be called "dummy patterns 52A" and those provided on the opposite side of the dummy patterns 50B with respect to the other of the patterns 41b may be called "dummy patterns 52B".

The dummy patterns 52 are each aligned linearly with the patterns 40 aligned in the column direction and spaced at the pitch P2 from the central axis of the adjacent one of the patterns 41b extending in the row direction. Specifically, the distance between the central axis of the dummy patterns 52 extending in the row direction and that of the adjacent one of the patterns 41b extending in the row direction is the pitch P2.

Further, the dummy patterns 52 are provided at the pitch P1 in the row direction. Specifically, the distance between the central axes of adjacent ones of the dummy patterns 52A extending in the column direction is the pitch P1, and the distance between the central axes of adjacent ones of the dummy patterns 52B extending in the column direction is the pitch P1.

The dummy patterns 53 are provided on the opposite side of the dummy patterns 51A with respect to the one of the patterns 41a and on the opposite side of the dummy patterns 51B with respect to the other of the patterns 41a. For ease of explanation, those of the dummy patterns 53 provided on the opposite side of the dummy patterns 51A with respect to the one of the patterns 41a may hereinafter be called "dummy patterns 53A" and those provided on the opposite side of the dummy patterns 51B with respect to the other of the patterns 41a may be called "dummy patterns 53B".

The dummy patterns 53 are each aligned linearly with the patterns 40 aligned in the row direction and spaced at the pitch P1 from the central axis of the adjacent one of the patterns 41a extending in the column direction. Specifically, the dummy patterns 53 each include dummy patterns 53a and 53b spaced from each other at a predetermined pitch and aligned in the column direction. When the dummy patterns 53a and 53b are taken as one pattern, each of the dummy patterns 53 is aligned linearly with the patterns 40 aligned in the row direction. The distance between the central axis of the dummy patterns 53a and 53b extending in the column direction and that of the adjacent one of the pattern 41 a extending in the column direction is the pitch P1.

The dummy patterns 53 are provided at the pitch P2 in the column direction. Specifically, the distance between the central axes of adjacent ones of the dummy patterns 53A extending in the row direction is the pitch P2, and the distance between the central axes of adjacent ones of the dummy patterns 53B extending in the row direction is the pitch P2. The "central axis of the dummy patterns 53 extending in the row direction" represents the axis at the same distance from the central axis of each of the dummy patterns 53a extending in the row direction and that of a corresponding one of the dummy patterns 53b extending in the row direction.

The dummy patterns 54 are provided at the intersections of the central axis of the dummy patterns 50 extending in the row direction and that of the dummy patterns 51a and 51b extending in the column direction. Further, the dummy patterns 54 are spaced at the pitch P1 in the row direction from the most adjacent one of the dummy patterns 50 and spaced at the pitch P2 in the column direction from the most adjacent one of the dummy patterns 51. Specifically, the distance between the central axis of each of the dummy patterns 54 extending in the column direction and that of the most adjacent one of the dummy patterns 50 extending in the column direction is the pitch P1, and the distance between the central axis of each of the dummy patterns 54 extending in the row direction and that of the most adjacent one of the dummy patterns 51 extending in the row direction is the pitch P2.

The dummy patterns 55 are provided at the intersections of the central axis of the dummy patterns 52 extending in the row direction and that of the dummy patterns 51a and 51b extending in the column direction. Further, the dummy patterns 55 are spaced at the pitch P1 in the row direction from the most adjacent one of the dummy patterns 52 and spaced at the pitch P2 in the row direction from the central axis of the most adjacent one of the patterns 41b. Specifically, the distance between the central axis of each of the dummy patterns 55 extending in the column direction and that of the most adjacent one of the dummy patterns 52 extending in the column direction is the pitch P1, and the distance between the central axis of each of the dummy patterns 55 extending in the row direction and that of the adjacent one of the patterns 41b extending in the row direction is the pitch P2.

The dummy patterns 50, 51a, 51b, 52, 53a, 53b, 54 and 55 are each reduced to, for example, one-quarter the shape of the patterns 40 so as not to be transferred to the photoresist.

When the mask pattern 56 is transferred to the photoresist on a reduced scale, e.g., on a one-fifth scale, the pitches P1 and P2 shown in FIG. 12 are five times those shown in FIG. 10, respectively.

Using the photomask 34 on which the above-described mask pattern 56 is formed, the photoresist 30 is exposed and is thereafter developed, so that the opening pattern such as shown in FIG. 4 is formed on the photoresist 30. Etching of the insulation layer 9 and silicon nitride film 8 using the photoresist 30 as a mask allows the openings 10 and trench 20 to be formed. Subsequently, the step shown in FIG. 8 is performed.

Figure 13:
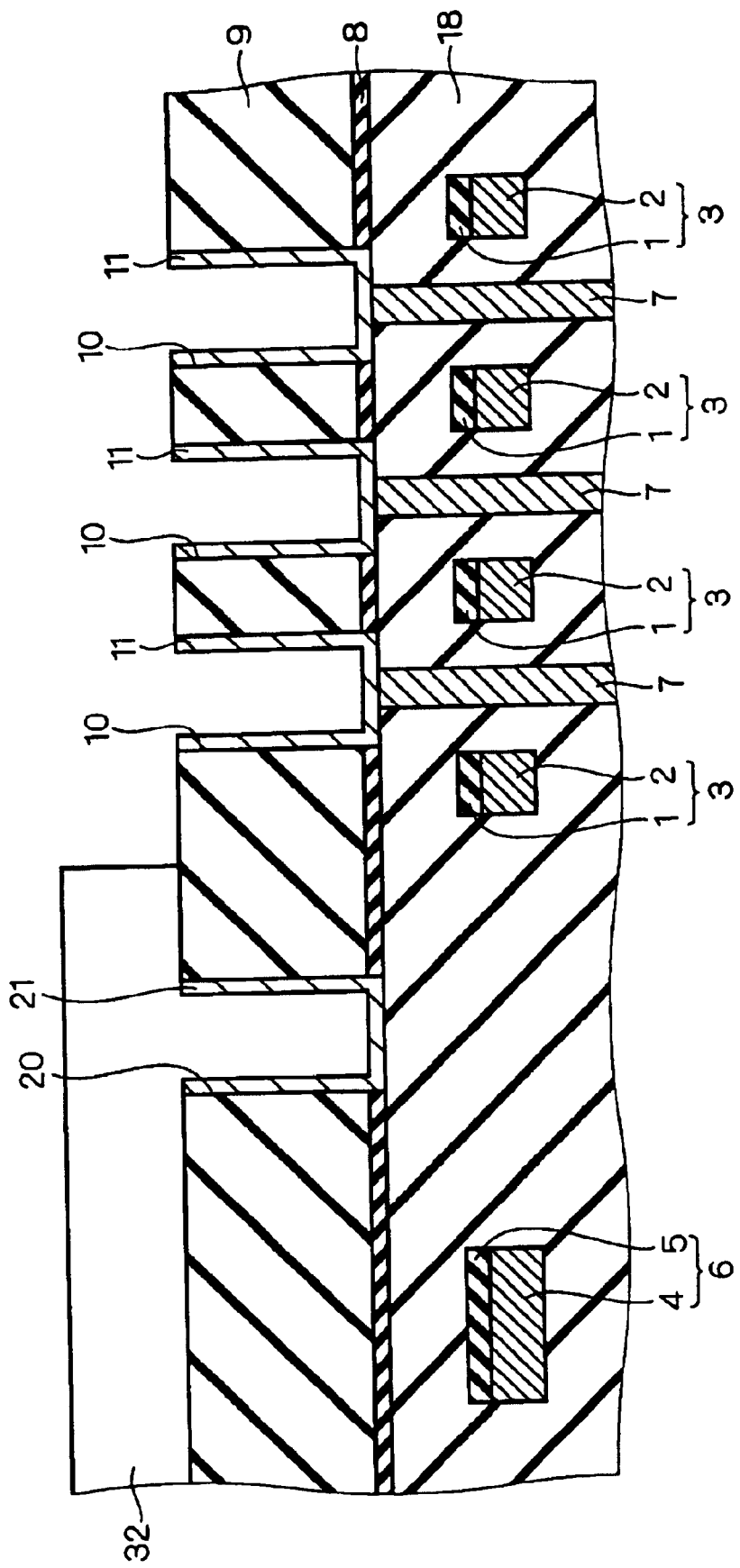
FIGS. 13 through 17 are sectional views showing the method of manufacturing the semiconductor memory according to the first preferred embodiment in sequential order.
Figure 14:
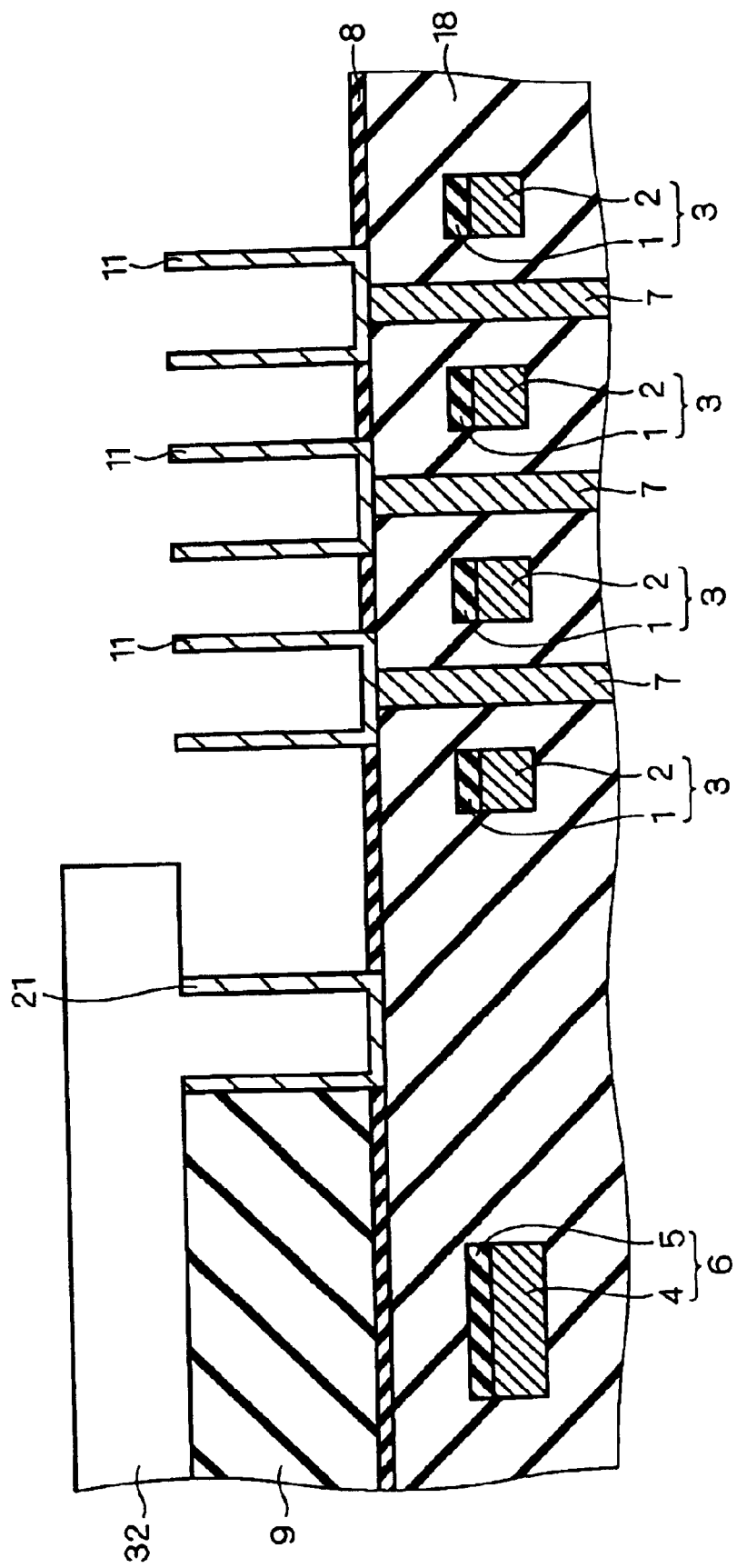
Figure 15:
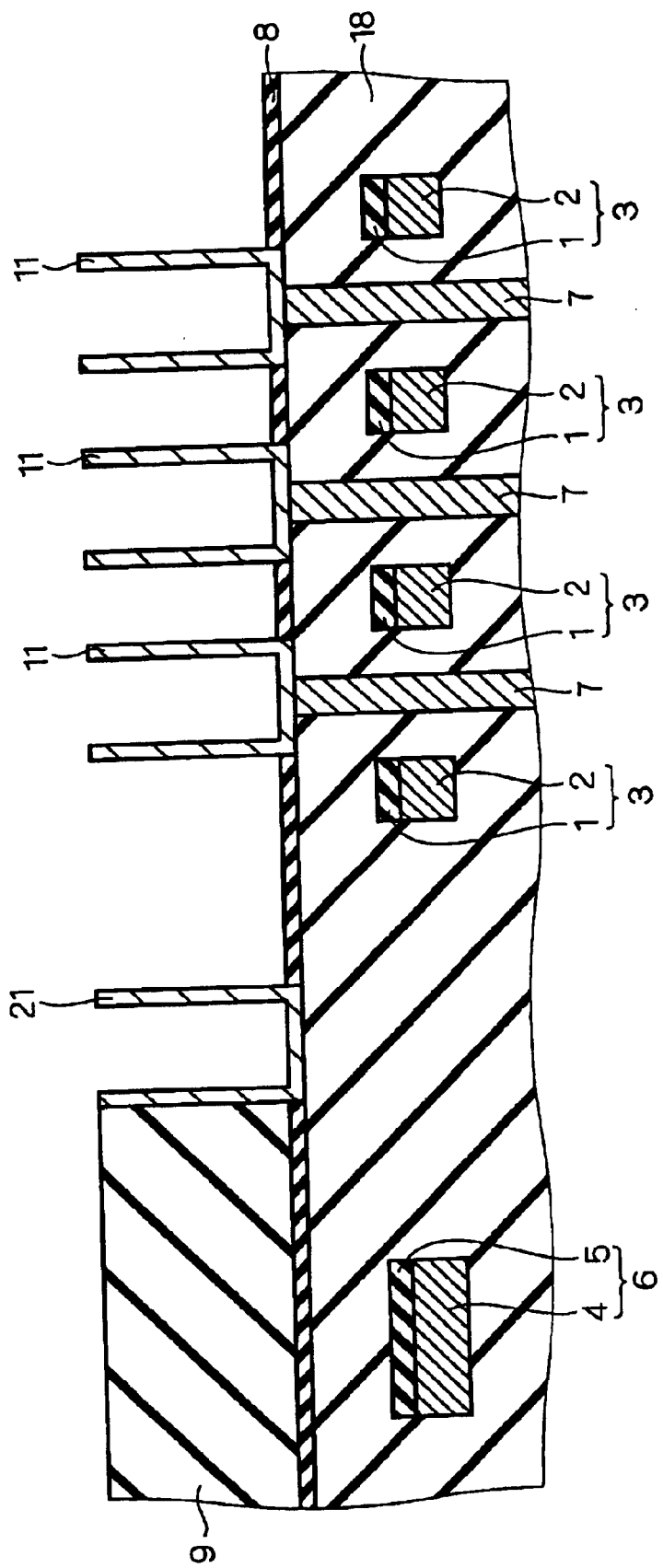

Next, as shown in FIG. 13, a resist 32 is formed on the insulation layer 9 and guard ring film 21 in the peripheral circuit forming region. Accordingly, the trench 20 is filled with the resist 32. As shown in FIG. 14, the insulation layer 9 is then selectively etched with fluoric acid, for example, using the resist 32 as a mask to remove the insulation layer 9 in the memory cell array forming region. As shown in FIG. 15, the resist 32 is then removed.

Figure 16:
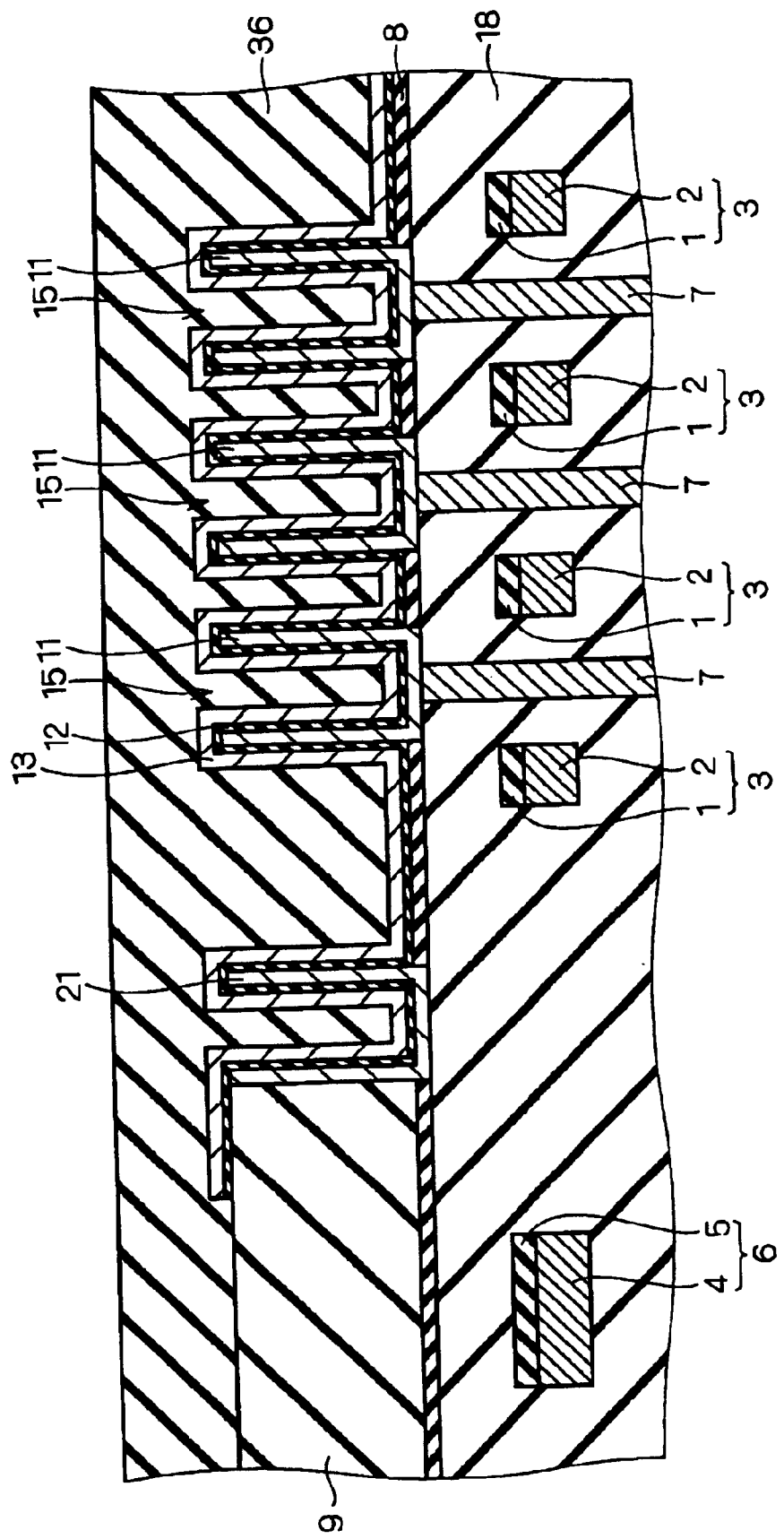

Next, as shown in FIG. 16, a dielectric film 12 of a capacitor is formed on the lower electrode 11, guard ring film 21 and silicon nitride film 8 in the memory cell array forming region, and an upper electrode 13 of a capacitor is formed on the dielectric film 12. Accordingly, a plurality of capacitors 15 are formed in the memory cell array forming region. Then, an insulation layer 36 made of, e.g., a silicon oxide film is formed over the insulation layer 9 and upper electrode 13.

Figure 17:
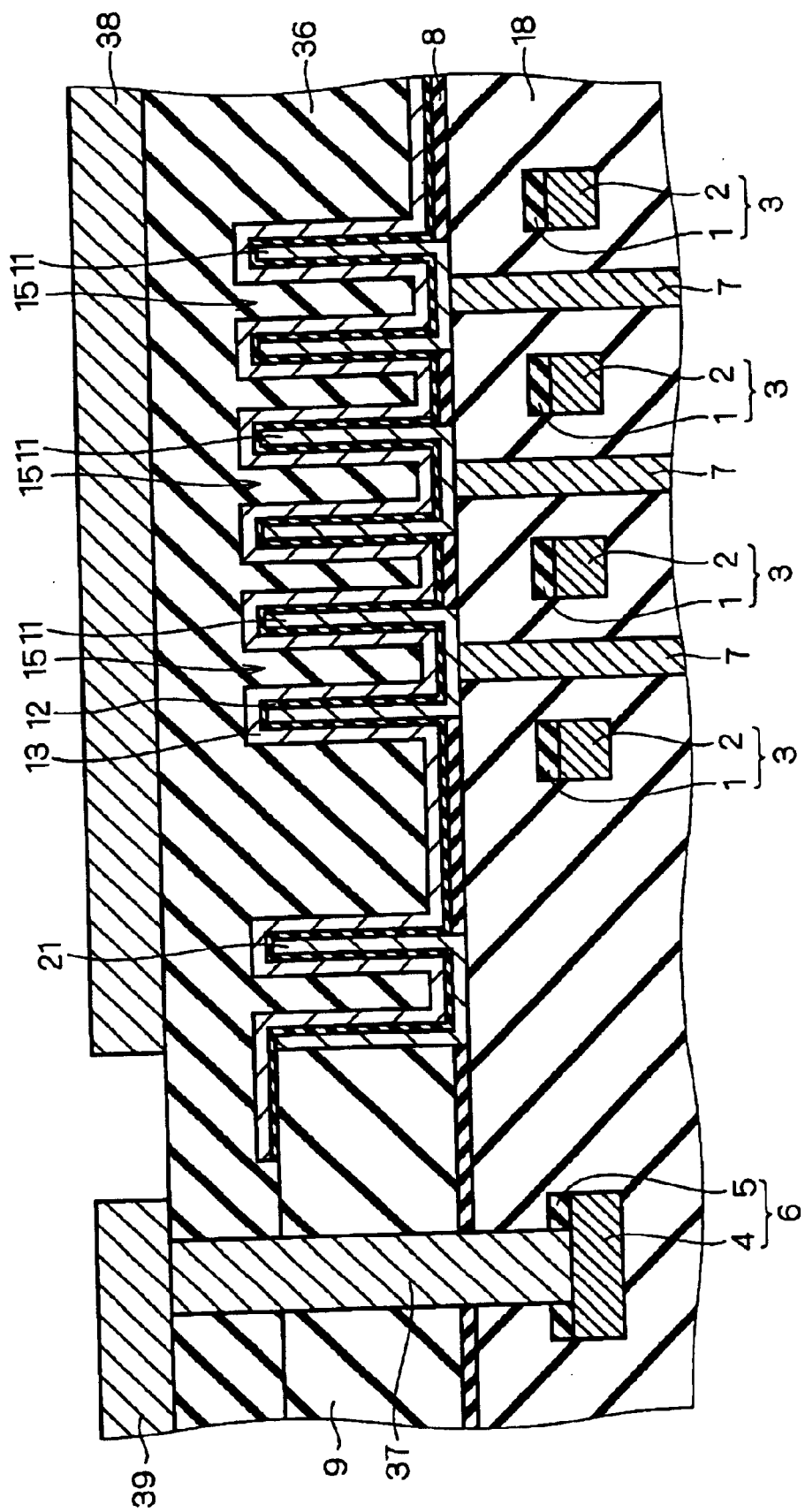

Next, as shown in FIG. 17, a contact plug 37 is formed in the insulation layers 9, 18 and 36 and silicon nitride films 5 and 8 in the peripheral circuit forming region to be in contact with the conductive film 4 of the bit line 6. The contact plug 37 is made of, e.g., tungsten having its upper surface exposed from the insulation layer 36.

A metal wire 39 is formed on the insulation layer 36 to be in contact with the contact plug 37. A metal wire 38 electrically insulated from the metal wire 39 is further formed on the insulation layer 36. The metal wires 38 and 39 are made of, e.g., aluminum.

With the above-described steps, the semiconductor memory having the memory cell array and the peripheral circuit thereof is completed.

As has been described, with the method of manufacturing the semiconductor memory according to the present embodiment, the guard ring film 21 is formed at the border between the memory cell array forming region and peripheral circuit forming region. This prevents fluoric acid or the like used in removing the insulation layer 9 in the memory cell array forming region from being impregnated into the insulation layer 9 in the peripheral circuit forming region as masked as shown in FIG. 14, so that the insulation layer 9 in the peripheral circuit forming region is not removed. As a result, a step height is prevented from appearing on the upper surface of the upper insulation layer 36, which makes it easier to form the metal wires 38 and 39 in a desired shape.

Further, with the method according to the present embodiment, the dummy patterns 51 are provided and spaced from the outermost ones of the patterns 40 aligned in the column direction at the same pitch as that of the patterns 40 in the row direction, allowing the periodicity of the patterns 40 to be maintained in the row direction. This allows the outermost ones of the patterns 40 aligned in the column direction to be transferred to the photoresist without significantly deviating from a desired size. Therefore, the outermost ones aligned in the column direction of the openings 10 arranged in a matrix can be formed closer to a desired shape as compared to the aforementioned method of manufacturing the conventional semiconductor memory.

Furthermore, the dummy patterns 50 are provided and spaced from the outermost ones of the patterns 40 aligned in the row direction at the same pitch as that of the patterns 40 in the column direction, allowing the periodicity of the patterns 40 to be maintained in the column direction. This allows the outermost ones of the patterns 40 aligned in the row direction to be transferred to the photoresist without significantly deviating from a desired size. Therefore, the outermost ones of the openings 10 aligned in the row direction can be formed closer to a desired shape as compared to the aforementioned method of manufacturing the conventional semiconductor memory.

As described, with the method according to the present embodiment, the outermost ones of the openings 10 arranged in a matrix can be formed closer to a desired shape, which can prevent adjacent ones of the openings 10 from communicating with each other and the lower electrode 11 from falling down. Thus, the semiconductor memory is improved in reliability as compared to the method of manufacturing the conventional semiconductor memory.

Further, with the method according to the present embodiment, the dummy patterns 51 and the adjacent one of the patterns 41*a* corresponding to the trenches 20*a* are spaced from each other at the same pitch as that of the patterns 40 in the row direction, allowing the periodicity in the row direction including the patterns 41*a* to be maintained. Thus, the patterns 41*a* can be transferred to the photoresist without significantly deviating from a desired size. Therefore, the trenches 20*a* extending in the column direction can be formed closer to a desired shape than in the case where the pitch between each of the patterns 41*a* and the adjacent ones of the dummy patterns 51 are not in agreement with the pitch P1 of the patterns 40 in the row direction.

Similarly, the dummy patterns 50 and the adjacent one of the patterns 41*b* corresponding to the trenches 20*b* are spaced from each other at the same pitch as that of the patterns 40 in the column direction, allowing the patterns 41*b* to be transferred to the photoresist without significantly deviating from a desired size. Thus, the trenches 20*b* extending in the row direction can be formed closer to a desired shape than in the case where the pitch between each of the patterns 41*b* and the adjacent ones of the dummy patterns 51 are not in agreement with the pitch P2 of the patterns 40 in the column direction.

Furthermore, with the method according to the present embodiment, the dummy patterns 53 are provided and spaced from the adjacent one of the patterns 41*a* corresponding to the trenches 20*a* at the same pitch as that of the patterns 40 in the row direction, allowing the patterns 41*a* to be formed still closer to a desired shape. Besides, the dummy patterns 52 are provided and spaced from the adjacent one of the patterns 41*b* corresponding to the trenches 20*b* at the same pitch as that of the patterns 40 in the column direction, allowing the patterns 41*b* to be formed still closer to a desired shape. Thus, the trenches 20 can be formed closer to a desired shape than in the case where the dummy patterns 52 and 53 are not provided.

Referring back to the aforementioned method of manufacturing the conventional semiconductor memory, the outermost ones of the openings 110 aligned in the column direction can be formed closer to a desired shape by providing the pattern 201 such that the outermost ones of the patterns 200 aligned in the column direction and part of the pattern 201 extending in the column direction are spaced at the same pitch as that of the patterns 200 in the row direction, that is, such that the pitches P111 and P110 are in agreement with each other. Similarly, the outermost ones of the openings 110 aligned in the row direction can be formed closer to a desired shape by providing the pattern 201 such that the outermost ones of the patterns 200 aligned in the row direction and part of the pattern 201 extending in the row direction are spaced at the same pitch as that of the patterns 200 in the column direction, that is, such that the pitches P211 and P210 are in agreement with each other.

Although the method of manufacturing the conventional semiconductor memory may be modified as described above to improve the semiconductor memory in reliability, the method according to the present embodiment is superior in the following points.

Figure 28:
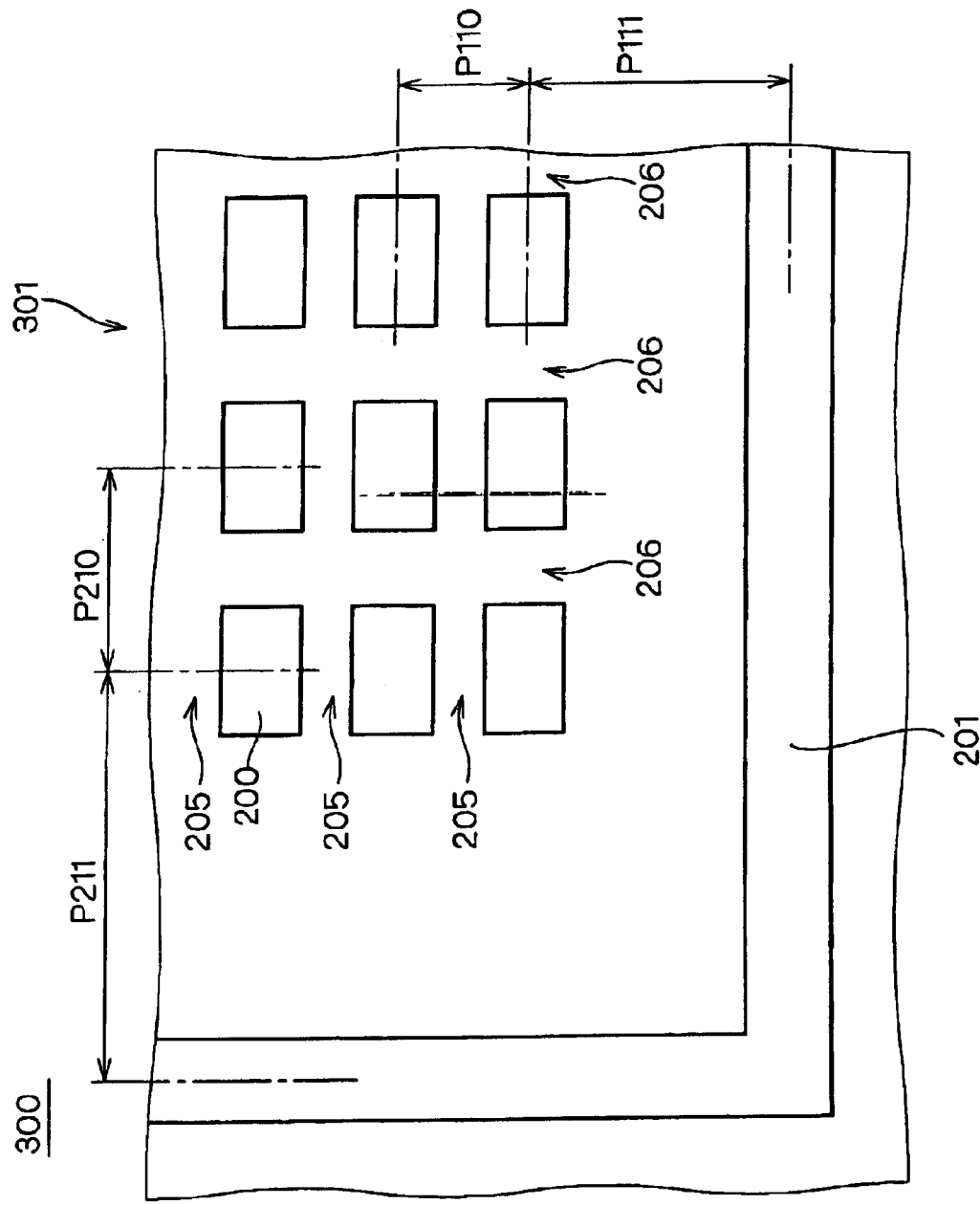
FIG. 28 a plan view showing a photomask used in the method of manufacturing the conventional semiconductor memory.
Figure 29:
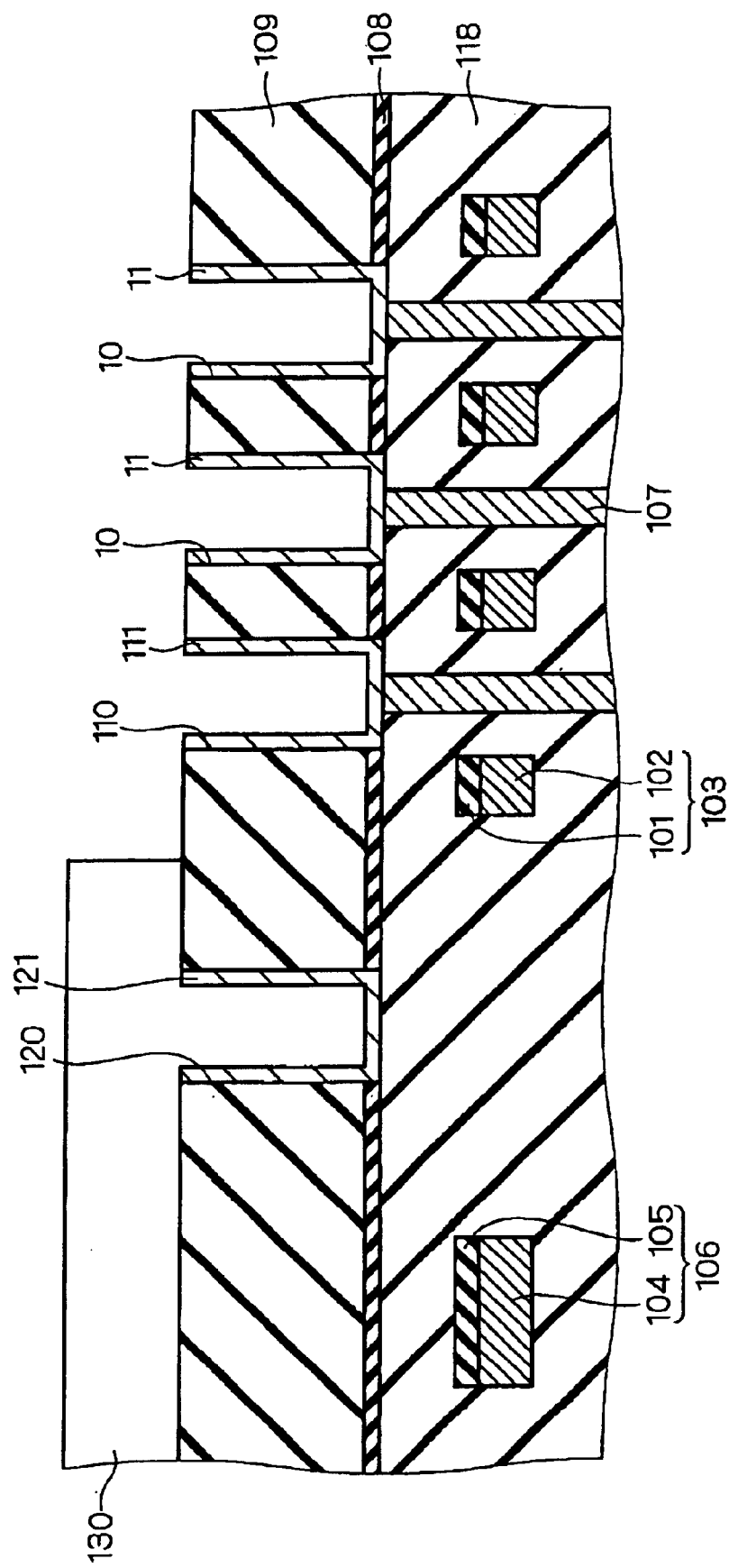
FIGS. 29 through 33 are sectional views showing the method of manufacturing the conventional semiconductor memory in sequential order.
Figure 30:
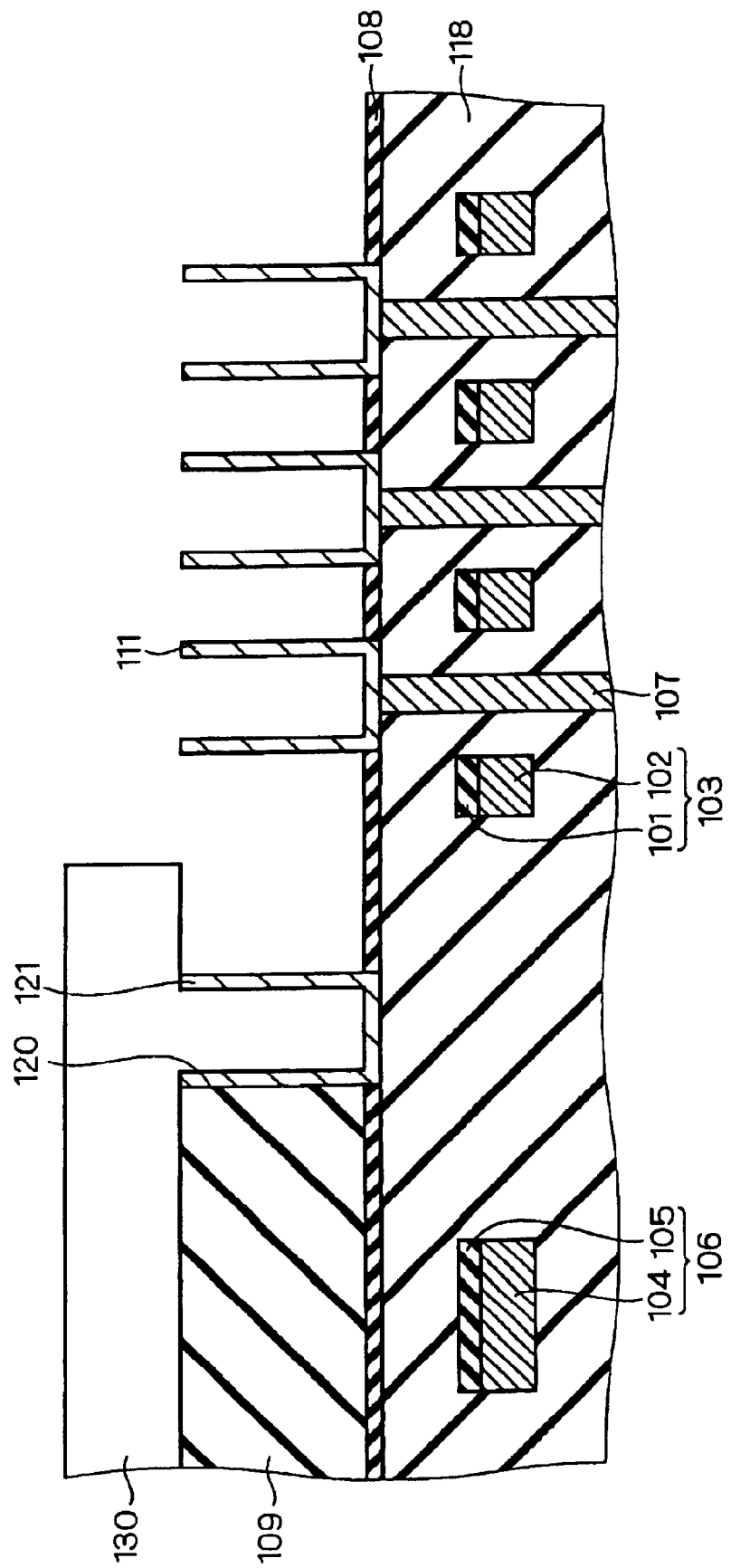
Figure 31:
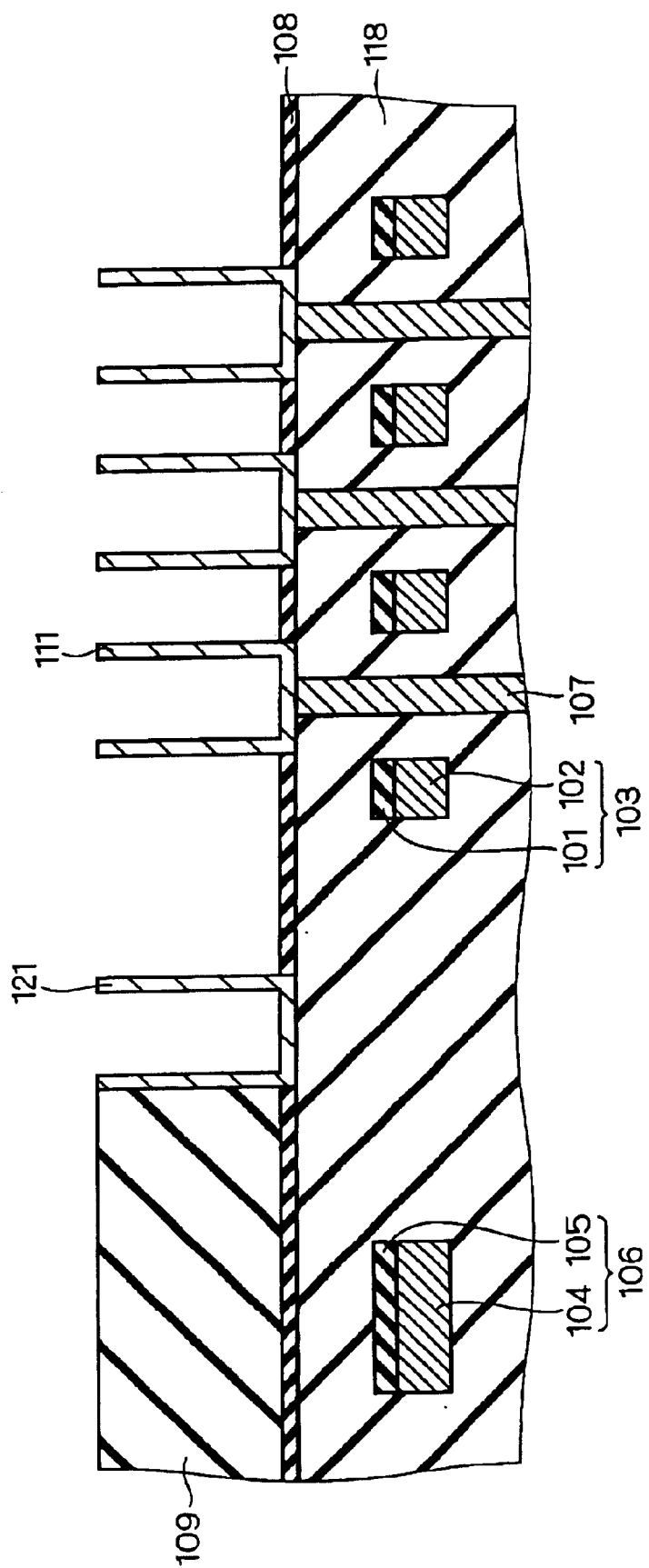
Figure 32:
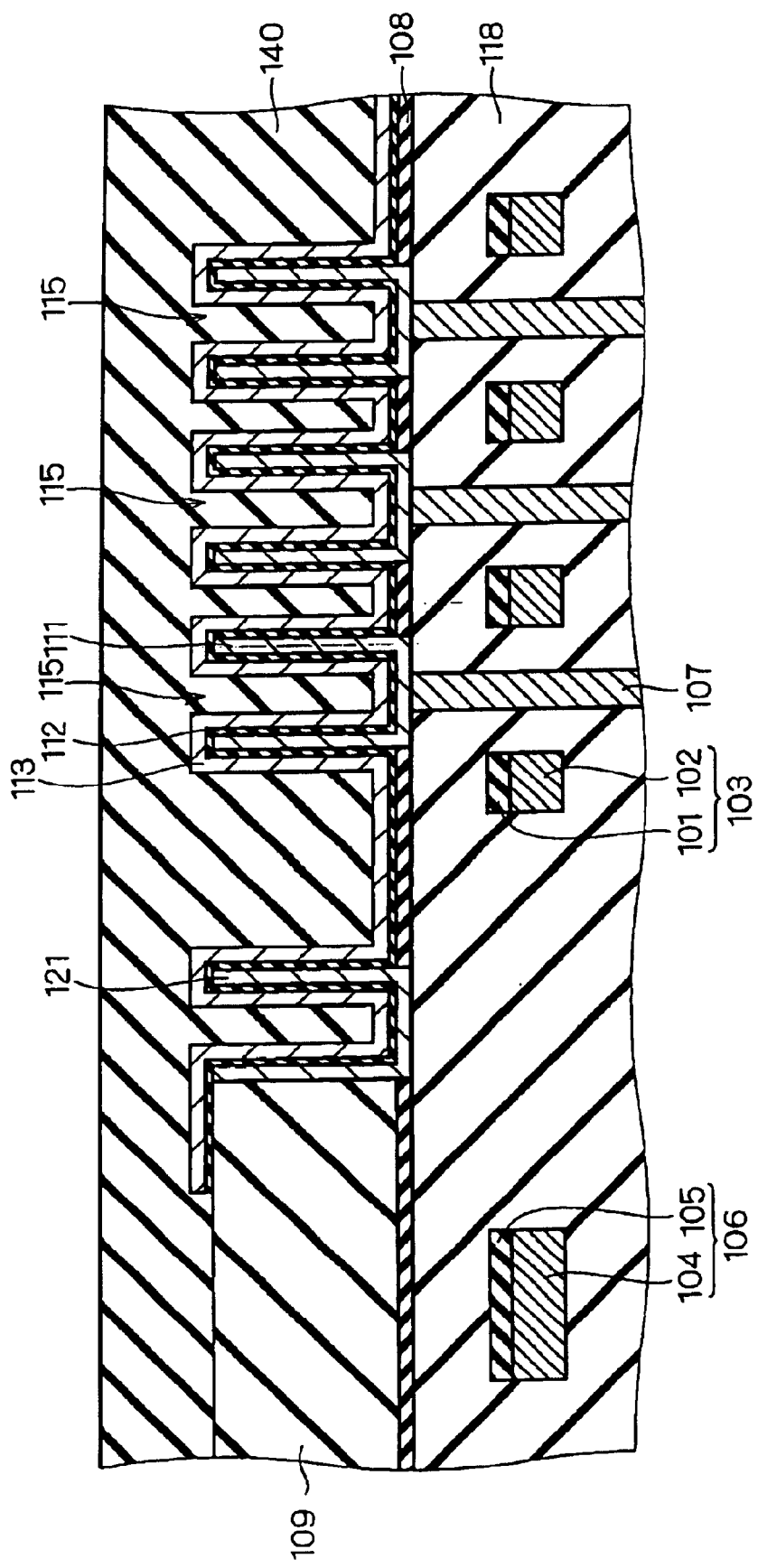
Figure 33:
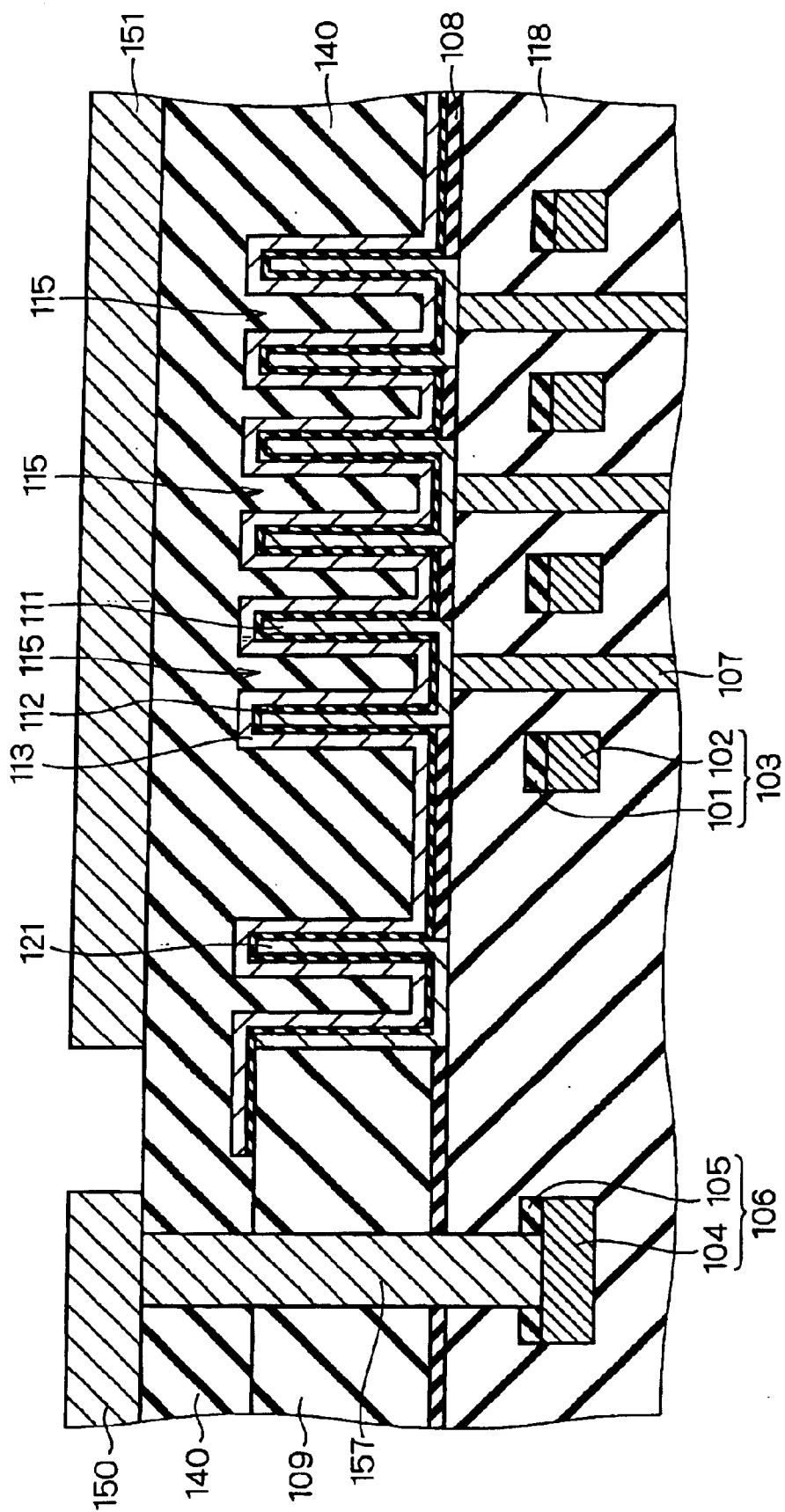

In the method of manufacturing the conventional semiconductor memory, the pattern 201 continuously extends in the row direction as shown in FIG. 28, so that the pattern 201 is adjacent in the column direction to regions 205 each defined between adjacent ones of the outermost ones of the patterns 200 aligned in the row direction where no pattern is present. Thus, when exposing the photoresist using the photomask 300, irradiated light passing through the pattern 201 may be leaked in the regions 205 as transferred to the photoresist. As a result, even when the pitches P211 and P210 are in agreement with each other, the shape of the outermost ones of the patterns 200 aligned in the row direction as transferred to the photoresist cannot be formed sufficiently close to a desired shape.

Similarly, the pattern 201 continuously extends in the column direction, so that the pattern 201 is adjacent in the row direction to regions 206 each defined between adjacent ones of the outermost ones of the patterns 200 aligned in the column direction where no pattern is present. Thus, when exposing the photoresist using the photomask 300, irradiated light passing through the pattern 201 may be leaked in the regions 206 as transferred to the photoresist. As a result, even when the pitches P111 and P110 are in agreement with each other, the shape of the outermost ones of the patterns 200 aligned in the column direction as transferred to the photoresist cannot be formed sufficiently close to a desired shape.

On the other hand, in the present embodiment, the dummy patterns 50 are each provided for each column of the patterns 40 at the pitch P2 from the most adjacent one of the patterns 40. Thus, the dummy patterns 50 can be arranged without being adjacent to regions 57 each defined between adjacent ones of the outermost ones of the patterns 40 aligned in the row direction where no pattern is present. This allows the shape of the outermost ones of the patterns 40 in the row direction as transferred to the photoresist to be formed closer to a desired shape than in the case where the pitches P211 and P210 are in agreement with each other in the background art.

Further, in the present embodiment, the dummy patterns 51 are each provided for each row of the patterns 40 at the pitch P1 from the most adjacent one of the patterns 40. Thus, the dummy patterns 51 can be arranged without being adjacent to regions 58 each defined between adjacent ones of the outermost ones of the patterns 40 in the column direction where no pattern is present. This allows the shape of the outermost ones of the patterns 40 aligned in the column direction as transferred to the photoresist to be formed closer to a desired shape than in the case where the pitches P111 and P110 are in agreement with each other in the background art.

Figure 18:
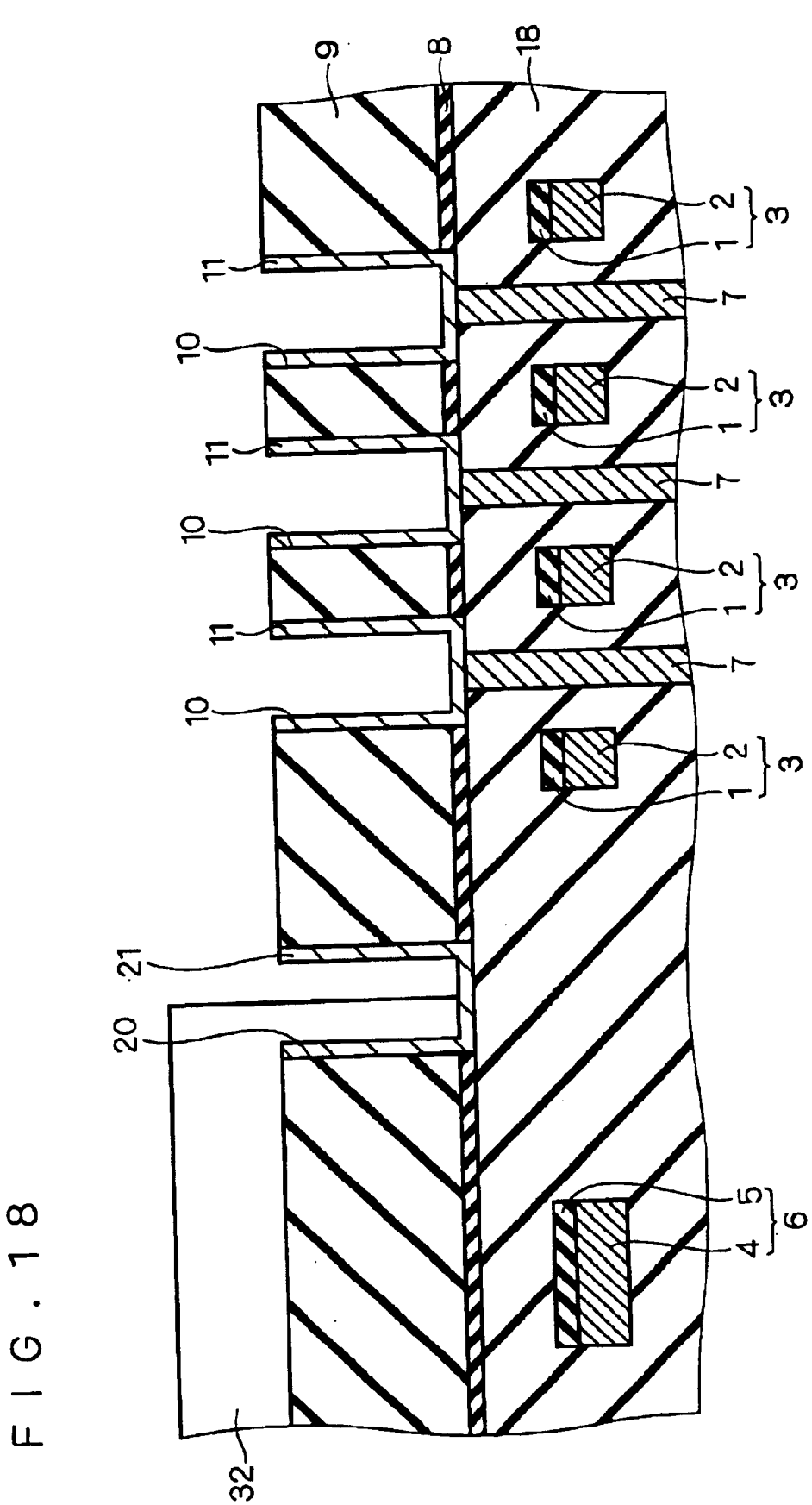
FIGS. 18 and 19 are sectional views showing the structure of the semiconductor memory according to the first preferred embodiment.

Although the trench 20 is filled with the resist 32 in the step shown in FIG. 13 in the present embodiment, the trench 20 is not necessarily filled with the resist 32 as shown in FIG. 18. Since the guard ring film 21 is formed on the surface of the trench 20, the resist 32 should only be formed on the insulation layer 9 in the peripheral circuit forming region. Whether or not the trench 20 is filled with the resist 32, fluoric acid is not impregnated into the insulation layer 9 in the peripheral circuit forming region in the step shown in FIG. 14.

Figure 19:
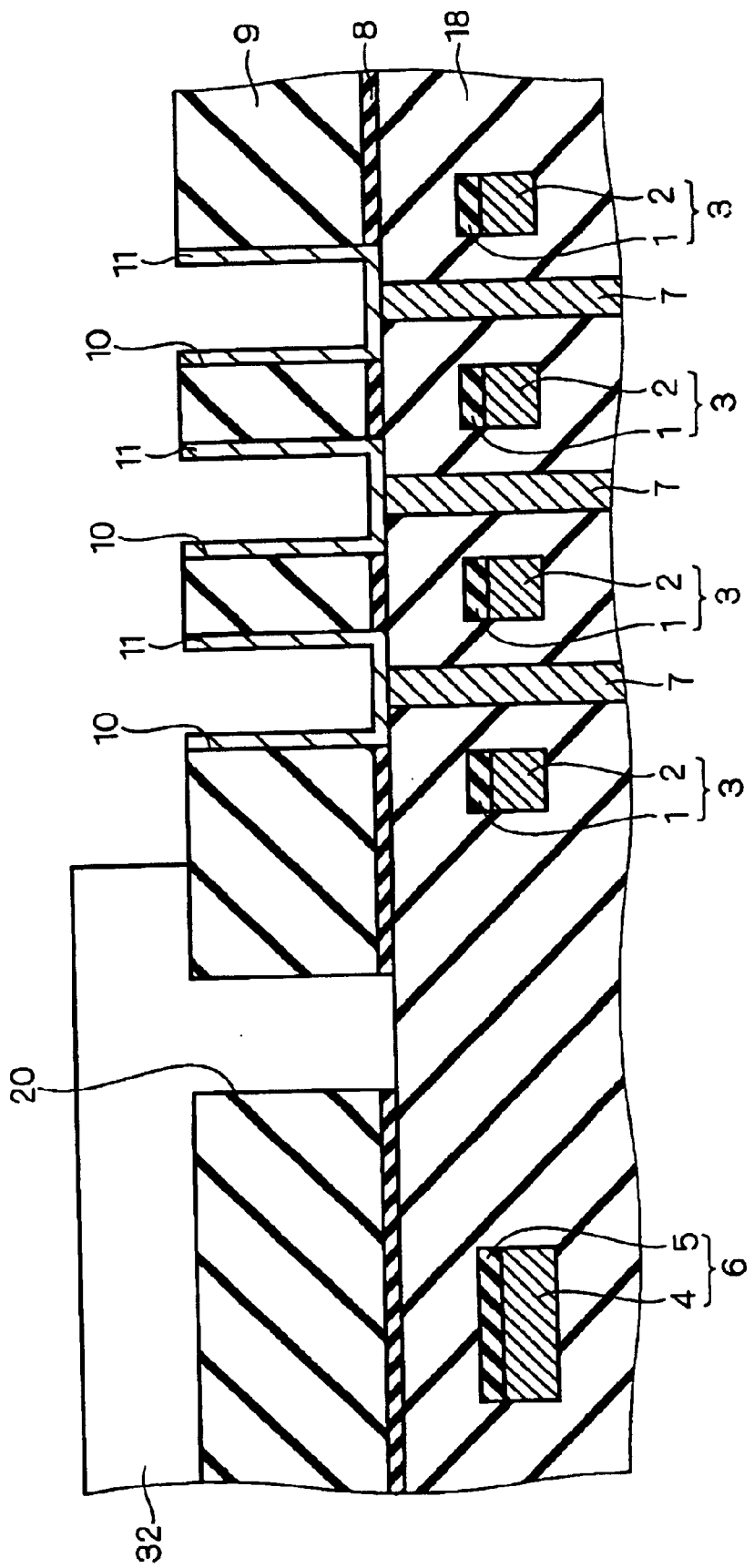

Further, although the guard ring film 21 is formed on the surface of the trench 20 in the present embodiment, the guard ring film 21 may not be provided if the trench 20 is filled with the resist 32 as shown in FIG. 19. The insulation layer 9 is etched using the resist 32 as a mask in the step shown in FIG. 14, which prevents fluoric acid from being impregnated into the insulation layer 9 in the peripheral circuit forming region in the step shown in FIG. 14 if the trench 20 is filled with the resist 32, even though the guard ring film 21 is not provided.

Second Preferred Embodiment

Figure 20:
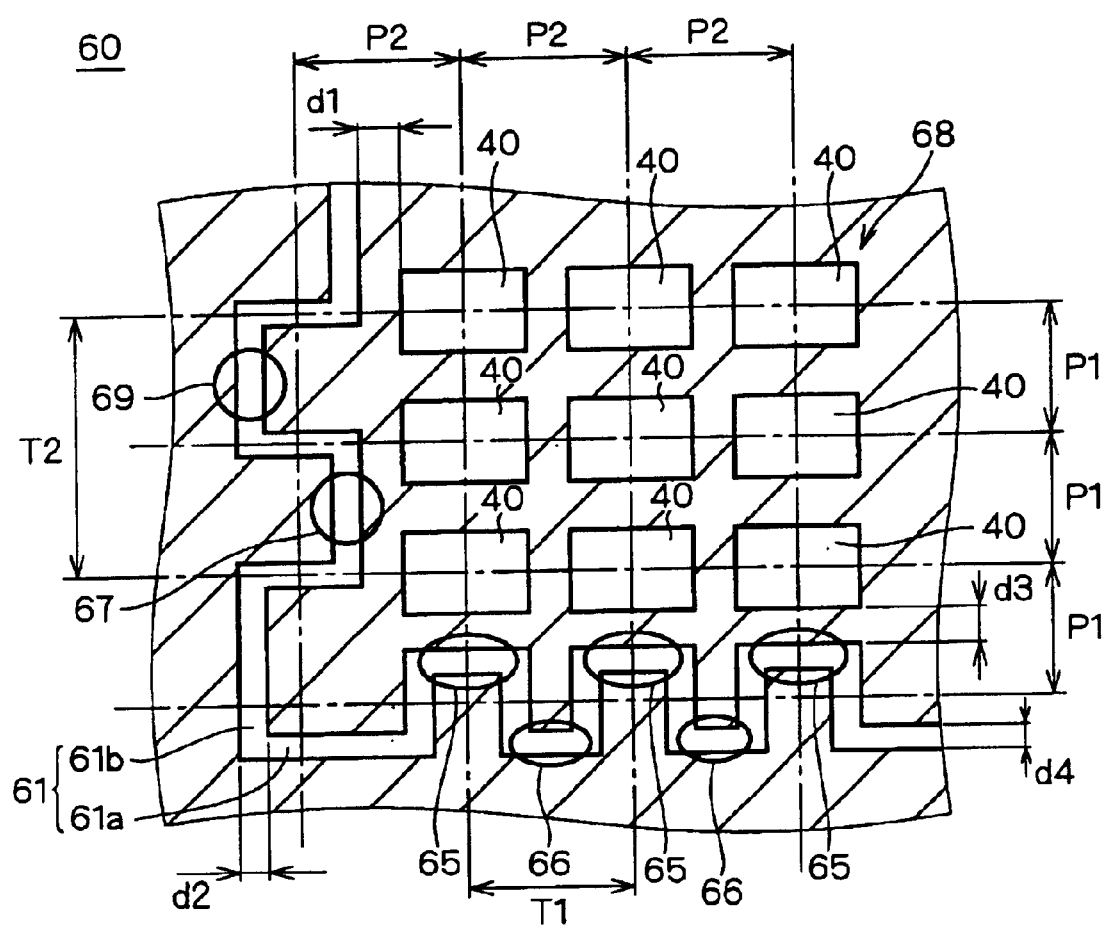
FIG. 20 is a plan view showing a photomask used in a method of manufacturing a semiconductor memory according to a second preferred embodiment of the present invention.
Figure 21:
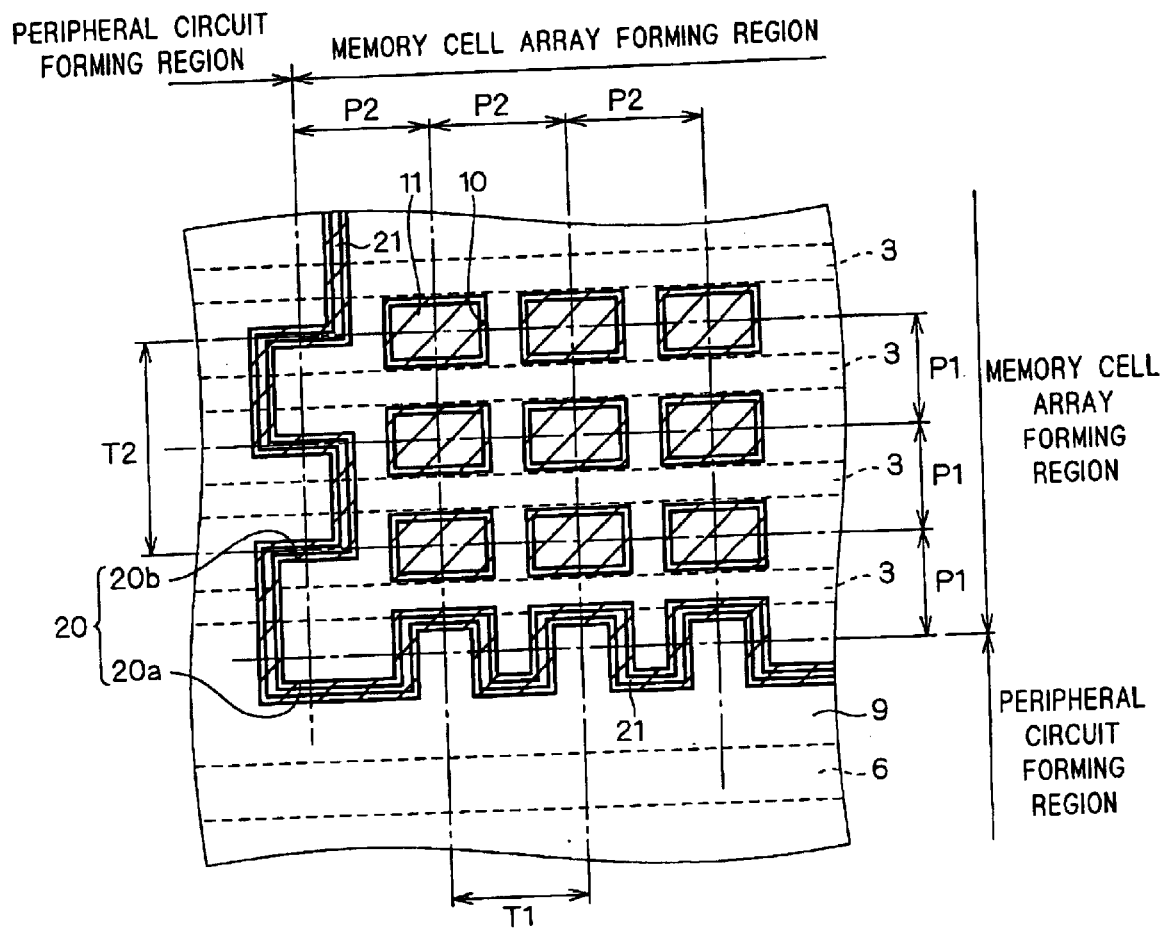
FIG. 21 is a plan view showing the structure of the semiconductor memory according to the first preferred embodiment.

FIG. 20 is a plan view showing a photomask 60 used in a method of manufacturing a semiconductor memory according to a second preferred embodiment of the present invention, which corresponds to aforementioned FIG. 12. FIG. 21 is a plan view of the semiconductor memory manufactured using the photomask 60 shown in FIG. 20, which corresponds to FIG. 10.

Though formed linearly in the column and row directions in the first preferred embodiment, the trench 20 is formed to meander in the column and row directions in the present embodiment as shown in FIG. 21. Further, the photomask 34 according to the first preferred embodiment is provided with the dummy patterns 50 to 55 which are not transferred to the photoresist, whereas the photomask 60 of the present embodiment is not provided with such dummy patterns. The method of manufacturing the semiconductor memory according to the present embodiment will be described in detail.

After performing the steps shown in FIGS. 1 and 2 in this order, the photoresist 30 is exposed using the photomask 60 shown in FIG. 20. The steps shown in FIGS. 4 through 8 are subsequently performed in this order. FIG. 21 is a plan view showing the structure of FIG. 8 viewed from an arrow A in the present embodiment.

As shown in FIG. 21, the trench 20 according to the present embodiment is provided in the insulation layer 9 at the border between the peripheral circuit forming region and memory cell array forming region and includes a pair of trenches 20a meandering in the column direction and a pair of trenches 20b meandering in the row direction. Basically, the trenches 20a and 20b of the present embodiment are modification of those of the first preferred embodiment to have a meandering shape, respectively. The trenches 20, 20a and 20b of the present embodiment may hereinafter be called "meandering trenches 20, 20a and 20b", respectively, to discriminate from those of the first preferred embodiment.

The central axis of each of the meandering trenches 20a extending in the column direction, i.e., the central axis of the meanders is spaced at the pitch P1 from the most adjacent ones of the openings 10 aligned in the column direction. Specifically, the distance between the central axis of each of the meandering trenches 20a extending in the column direction and that of the most adjacent ones of the openings 10 aligned in the column direction is the pitch P1. Further, the central axis of each of the meandering trenches 20b extending in the row direction, i.e., the central axis of the meanders is spaced at the pitch P2 from the most adjacent ones of the openings 10 aligned in the row direction. Specifically, the distance between the central axis of each of the meandering trenches 20a extending in the column direction and that of the most adjacent ones of the openings 10 aligned in the row direction is the pitch P2. The meandering trenches 20 each have a width of one fourth that of the openings 10 in the column direction. The other structure is the same as that shown in FIGS. 9 and 10, and a repeated explanation thereof is omitted here.

Next, the photomask 60 used in forming the openings 10 and the meandering trench 20 will be described referring to FIG. 20. The photomask 60 shown in FIG. 20 is of a positive-type used for transferring a mask pattern to a photoresist on an equal scale.

As shown in FIG. 20, the photomask 60 is provided with a mask pattern 68 including the plurality of patterns 40 corresponding to the openings 10 and a pattern 61 corresponding to the meandering trench 20.

The pattern 61 is formed to surround the patterns 40. Specifically, the pattern 61 includes a pair of patterns 61a corresponding to the trenches 20a and meandering in the column direction and a pair of patterns 61b corresponding to the trenches 20b and meandering in the row direction. Basically, the patterns 61a and 61b are modification of the patterns 41a and 41b shown in FIG. 12 to have a meandering shape, respectively.

The central axis of each of the patterns 61a extending in the column direction, i.e., the central axis of the meanders is spaced at the pitch P1 from the most adjacent ones of the patterns 40 aligned in the column direction. Specifically, the distance between the central axis of each of the patterns 61a extending in the column direction and that extending in the column direction of the most adjacent ones of the patterns 40 aligned in the column direction is the pitch P1. A meandering cycle T1 of the patterns 61a is in agreement with the pitch P2 of the patterns 40 in the column direction. The patterns 61a have projecting portions 65 closer to the patterns 40 aligned linearly with the patterns 40 in the row direction, and projecting portions 66 away from the patterns 40 each arranged on the extension of a region between adjacent ones of the patterns 40 in the column direction.

The central axis of each of the patterns 61b extending in the row direction, i.e., the central axis of the meanders is spaced at the pitch P2 from the most adjacent ones of the patterns 40 aligned in the row direction. Specifically, the distance between the central axis of each of the patterns 61b extending in the row direction and that extending in the row direction of the most adjacent ones of the patterns 40 aligned in the row direction is the pitch P2. A meandering cycle T2 of the patterns 61b is twice the pitch P1 of the patterns 40 in the row direction.

Width d4 of the patterns 61a is, e.g., one fourth the width of the patterns 40 in the column direction. Distance d3 between each of the projecting portions 65 of the patterns 61a and the most adjacent one of the patterns 40 is, e.g., half the width of the patterns 40 in the row direction. Width d2 of the patterns 61b or distance d1 in the column direction between each of the projecting portions 67 of the patterns 61b and the most adjacent one of the patterns 40 is, e.g., one fourth the width of the patterns 40 in the column direction.

The photoresist 30 is exposed using the photomask 60 having the mask pattern 68 as described above formed thereon and is developed thereafter, so that a predetermined opening pattern is formed on the photoresist 30. Next, the insulation layer 9 and silicon nitride film 8 are etched using the photoresist 30 as a mask, thereby forming the openings 10 and meandering trench 20. The step shown in FIG. 8 is then performed to obtain the structure shown in FIG. 21.

Next, the steps shown in FIGS. 13 through 17 are performed in this order. Accordingly, the semiconductor memory including the memory cell array and peripheral circuit thereof is completed.

As has been described, with the method of manufacturing the semiconductor memory according to the present embodiment, the guard ring film 21 is formed at the border between the memory cell array forming region and peripheral circuit forming region, similarly to the above-described first preferred embodiment. This prevents fluoric acid or the like used in removing the insulation layer 9 in the memory cell array forming region from being impregnated into the insulation layer 9 in the peripheral circuit forming region, so that the insulation layer 9 in the peripheral circuit forming region is not removed. As a result, a step height is prevented from appearing on the upper surface of the upper insulation layer 36, which makes it easier to form the metal wires 38 and 39 in a desired shape.

Further, with the method of the present embodiment, the meandering trench 20 on which the guard ring film 21 is formed meandering in the column and row directions, causing the guard ring film 21 to also meander. Thus, the guard ring film 21 is unlikely to fall down after the execution of the step shown in FIG. 14 as compared to the conventional method in which the guard ring film 121 is formed extending linearly in the column and row directions. As a result, the semiconductor memory is improved in reliability as compared to that manufactured with the conventional method.

Furthermore, the patterns 61a provided for the photomask 60 used in the present embodiment each have projecting portions 65 in the row direction aligned linearly with the patterns 40 and projecting portions 66 in the column direction, each positioned on the extension of a region between adjacent ones of the patterns 40 in the column direction. In the case where the patterns 61b have projecting portions 67 closer to the patterns 40 each positioned on the extension of a region between adjacent ones of the patterns 40 in the row direction, irradiated light passing through the projecting portions 67 of the patterns 61b when exposing the photoresist using the mask pattern 68 is likely to be leaked in regions each defined between adjacent ones of the patterns 40 in the row direction as transferred to the photoresist. Thus, the outermost ones of the patterns 40 aligned in the row direction cannot be formed sufficiently close to a desired shape.

However, the patterns 61a have the projecting portions 65 closer to the patterns 40 aligned in the row direction linearly with the patterns 40, so that irradiated light passing through the projecting portions 65 of the patterns 61a when exposing the photoresist using the mask pattern 68 is unlikely to be leaked in regions each defined between adjacent ones of the patterns 40 in the column direction as transferred to the photoresist. Further, although the projecting portions 66 of the patterns 61a are each positioned on the extension of a region between adjacent ones of the patterns 40 in the column direction, the projecting portions 66 are provided away from the patterns 40 as compared to the projecting portions 65, so that irradiated light passing through the projecting portions 66 is unlikely to be leaked in regions each defined between adjacent ones of the patterns 40 in the column direction as transferred to the photoresist.

Consequently, the shape of the outermost ones of the patterns 40 aligned in the column direction as transferred to the photoresist can be formed sufficiently close to a desired shape, and therefore, the shape of the outermost ones of the openings 10 aligned in the column direction can be formed sufficiently close to a desired shape. As a result, the semiconductor memory is improved in reliability as compared to the case where the patterns 61a are formed like the patterns 61b, that is, the case where the projecting portions 65 are each arranged in the row direction on the extension of a region between adjacent ones of the patterns 40 in the column direction. This effect will hereinafter be referred to as "first effect".

Further, with the method according to the present embodiment, each of the patterns 61a corresponding to the meandering trenches 20a is also spaced from the most adjacent ones of the patterns 40 aligned in the column direction at the same pitch as that of the patterns 40 in the row direction, allowing the periodicity of the patterns 40 to be maintained in the row direction. This allows the outermost ones of the patterns 40 aligned in the column direction to be transferred to the photoresist without significantly deviating from a desired size. Therefore, the outermost ones of the patterns 40 aligned in the column direction can be formed closer to a desired shape than in the case where the pitch between each of the patterns 61a and the most adjacent ones of the patterns 40 aligned in the column direction is not in agreement with the pitch P1 of the patterns 40 in the column direction.

Similarly, each of the patterns 61b corresponding to the meandering trenches 20b is spaced from the most adjacent ones of the patterns 40 aligned in the row direction at the same pitch as that of the patterns 40 in the column direction, allowing the outermost ones of the patterns 40 aligned in the row direction to be transferred to the photoresist without significantly deviating from a desired size. Therefore, the outermost ones of the patterns 40 aligned in the row direction can be formed closer to a desired shape than in the case where the pitch between each of the patterns 61a and the most adjacent ones of the patterns 40 aligned in the column direction is not in agreement with the pitch P2 of the patterns 40 in the row direction.

As has been described, with the method of the present embodiment, the outermost ones of the openings 10 arranged in a matrix can be formed close to a desired shape, which improves the semiconductor memory in reliability as compared to the method of manufacturing the conventional semiconductor memory.

The patterns 61b, though formed as described above in the present embodiment, may be formed like the patterns 61a by increasing the width of the patterns 40 in the row direction. Specifically, the meandering cycle T2 of the patterns 61b is brought in agreement with the pitch P1 of the patterns 40 in the row direction, and the projecting portions 67 of the patterns 61b are arranged in the row direction linearly with the patterns 40, and projecting portions 69 away from the patterns 40 are each arranged in the row direction on the extension of a region between adjacent ones of the patterns 40 in the row direction. Accordingly, the outermost ones of the openings 10 aligned in the row direction are formed still closer to a desired shape.

Further, since the guard ring film 21 is formed on the meandering trench 20, the trench 20 is not necessarily filled with the resist 32 as mentioned in the aforementioned first preferred embodiment (cf. FIG. 18).

Furthermore, the guard ring film 21 may not be provided if the trench 20 is filled with the resist 32, similarly to the aforementioned first preferred embodiment.

Figure 22:
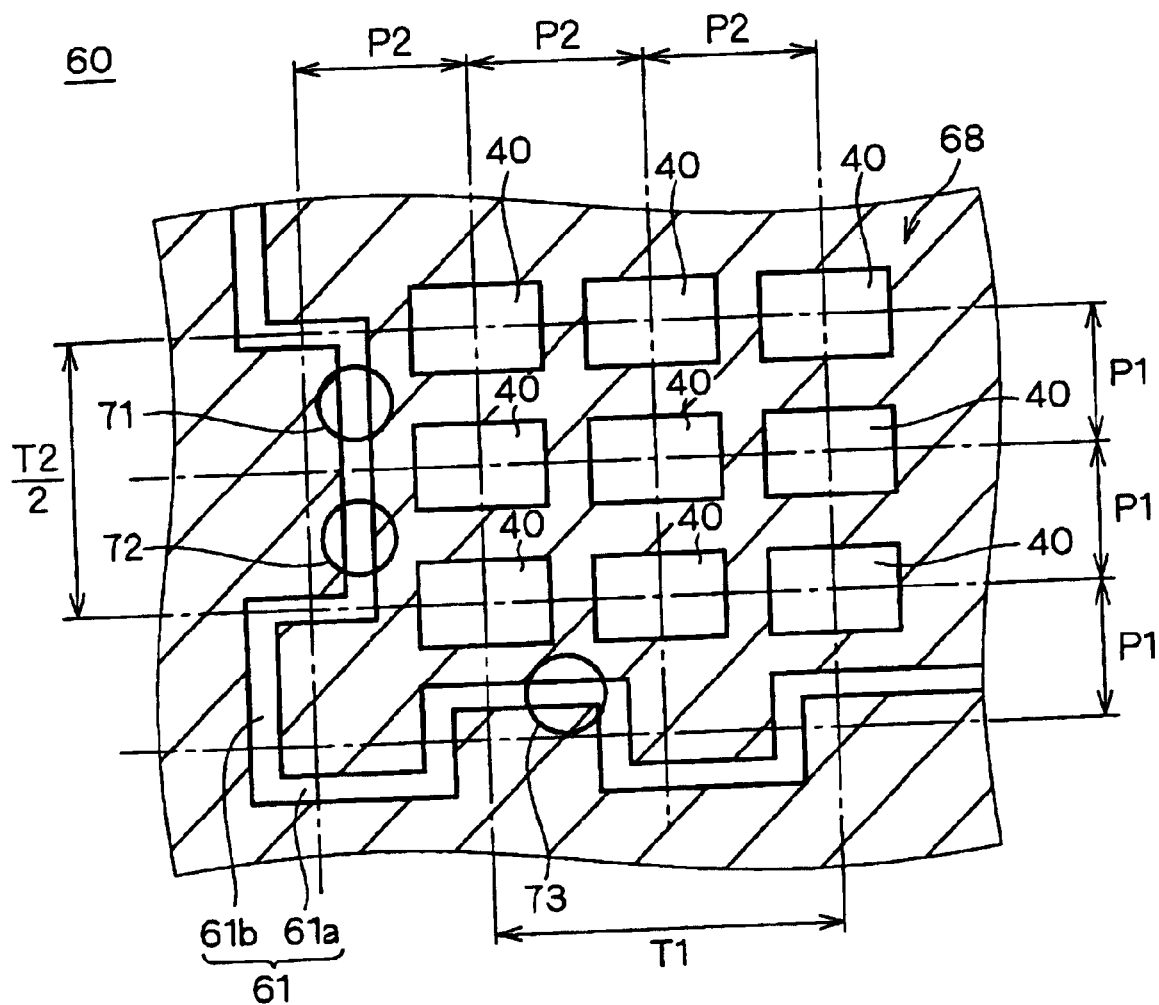
FIG. 22 is a plan view showing the photomask used in the method of manufacturing the semiconductor memory according to the second preferred embodiment.

Still further, as shown in FIG. 22, the meandering cycles of the patterns 61a and 61b may be doubled, for example, expecting, rather than the aforementioned "first effect", the effect of forming the meandering trench 20 with more reliability. As shown in FIG. 22, the meandering cycle of the patterns 61a is set double the pitch P2 of the patterns 40 in the column direction and that of the patterns 61b is set four times the pitch P1 of the patterns 40 in the row direction.

When the mask pattern 68 shown in FIG. 20 is transferred to the photoresist, the transferred pattern may not present the meandering shape since the meandering cycles of the patterns 61a and 61b are short. Accordingly, the trench 20 may not present the meandering shape.

Increasing the meandering cycles of the patterns 61a and 61b as shown in FIG. 22 can ensure that the transferred pattern presents the meandering shape. This allows the meandering trench 20 to be formed on the insulation layer 9 with reliability.

Third Preferred Embodiment

Figure 23:
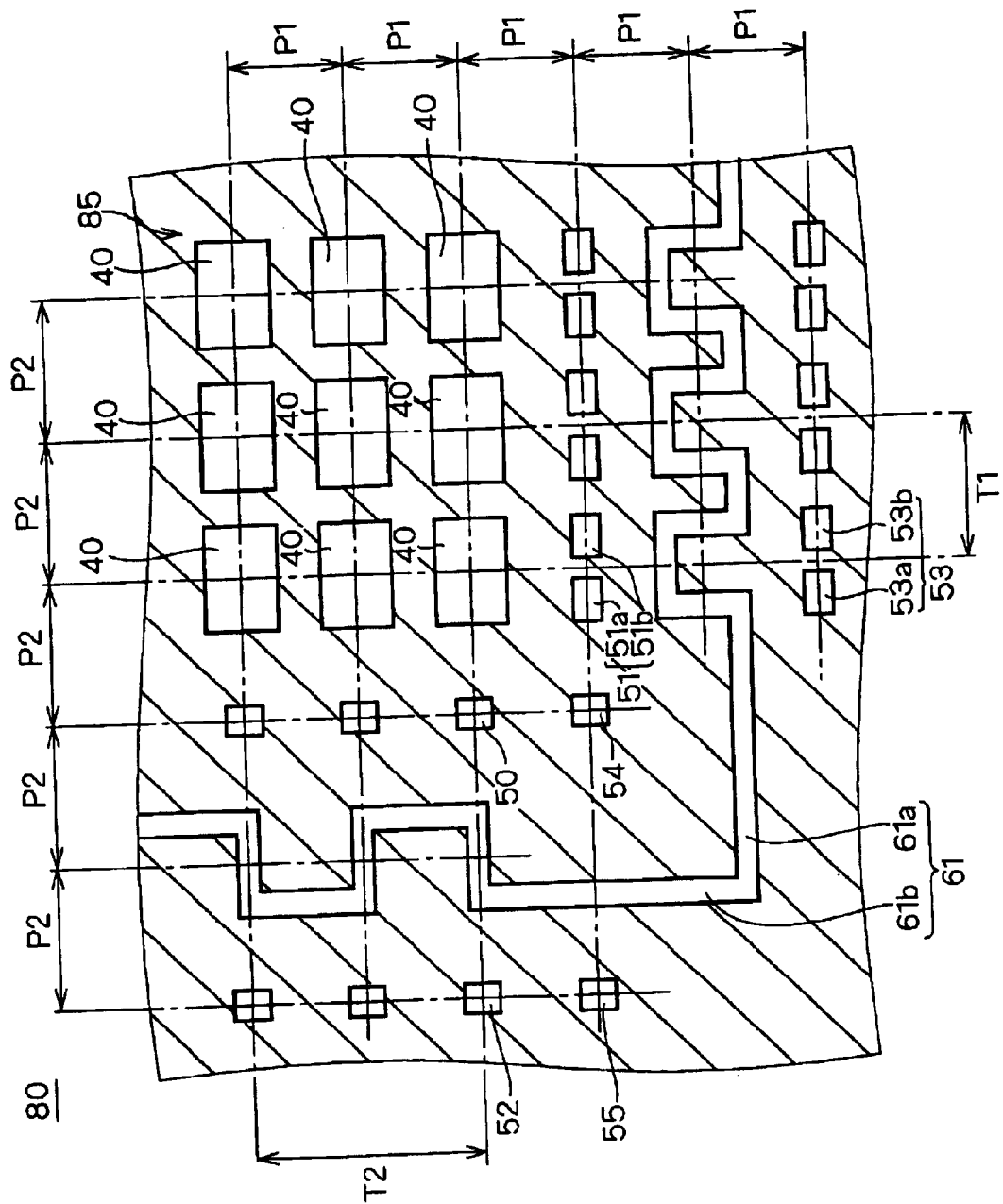
FIG. 23 is a plan view showing a photomask used in a method of manufacturing a semiconductor memory according to a third preferred embodiment of the present invention.

FIG. 23 is a plan view showing a photomask 80 used in a method of manufacturing a semiconductor memory according to a third preferred embodiment of the present invention. The photomask 80 of the present embodiment is obtained by replacing the pattern 41 in the photomask 34 of the first preferred embodiment with the pattern 61 formed in the photomask 60 of the second preferred embodiment shown in FIG. 20.

As shown in FIG. 23, the photomask 80 is provided with a mask pattern 85 including the plurality of patterns 40, the pattern 61 and the plurality of dummy patterns 50 to 55 which are not transferred to a photoresist.

The central axis extending in the column direction of each of the patterns 61a of the pattern 61 is spaced at the pitch P1 from the central axes of the dummy patterns 51 and 53, respectively. The central axis extending in the row direction of each of the patterns 61b of the pattern 61 is spaced at the pitch P2 from the central axes of the dummy patterns 50 and 52, respectively. The other structure of the mask pattern 85 is the same as the mask pattern 56 of the photomask 34 shown in FIG. 12 and the pattern 61 of the photomask 60 shown in FIG. 20, and a repeated explanation thereof is omitted here.

Figure 24:
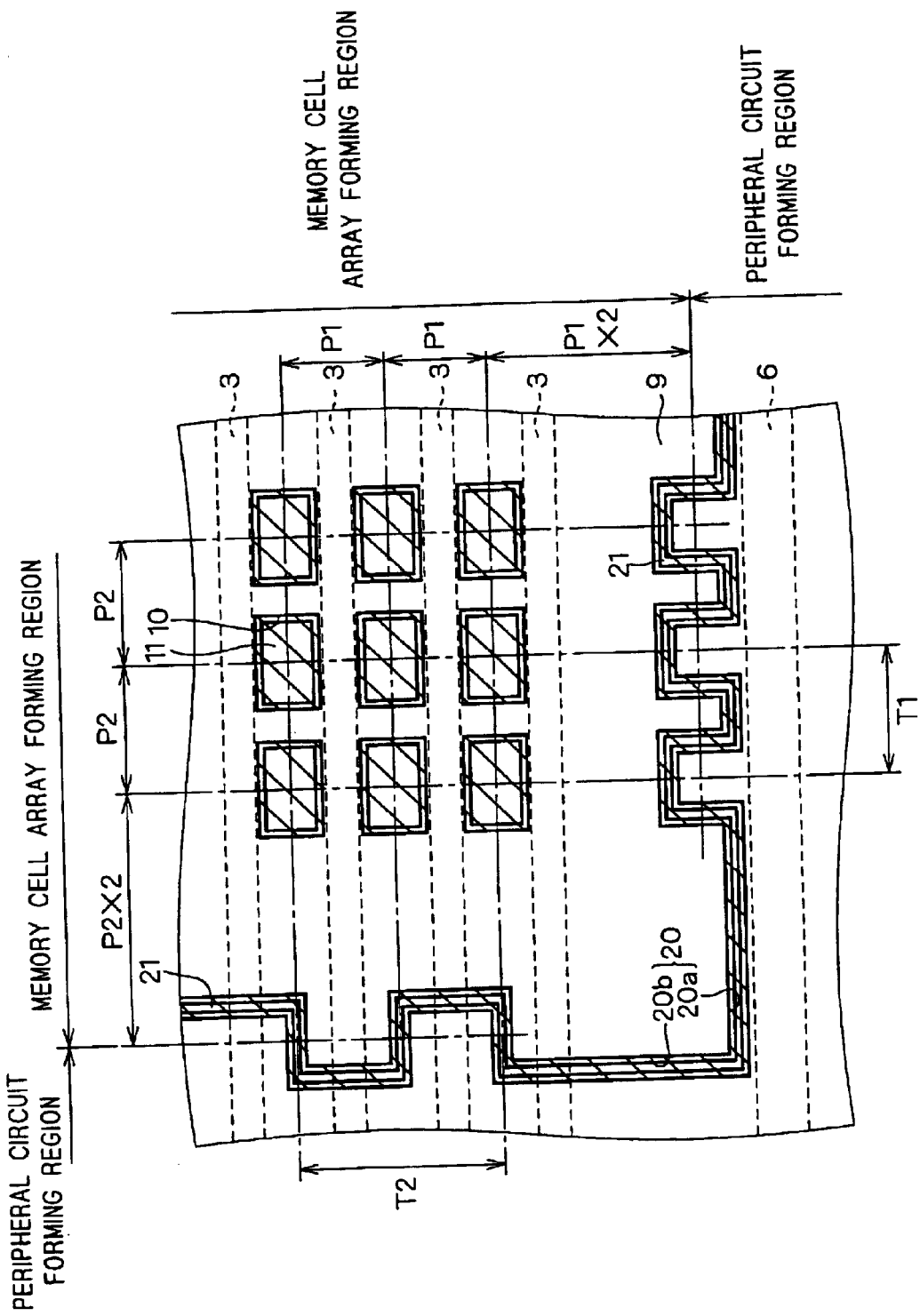
FIG. 24 is a plan view showing the structure of the semiconductor memory according to the third preferred embodiment.

Next, the method according to the present embodiment will be described briefly. After performing the steps shown in FIGS. 1 and 2 in this order, the photoresist 30 is exposed using the photomask 80 shown in FIG. 23. Subsequently, the steps shown in FIGS. 4 through 8 are performed in this order. FIG. 24 is a plan view showing the structure of FIG. 8 according to the present embodiment viewed from an arrow A. As shown in FIG. 24, the trench 20 has the meandering shape.

Subsequently, the steps shown in FIGS. 13 through 17 are performed in this order. Accordingly, the semiconductor memory including a memory cell array and a peripheral circuit thereof is completed.

With the photomask 60 according to the second preferred embodiment shown in FIG. 20, irradiated light passing through the projecting portions 67 of the patterns 61b at the time of exposure is likely to be leaked in regions each defined between adjacent ones of the patterns 40 in the row direction as transferred to the photoresist. Thus, the shape of the outermost ones of the patterns 40 as transferred to the photoresist cannot be formed sufficiently close to a desired shape. Further, with the photomask 60 according to the second preferred embodiment shown in FIG. 22, irradiated light passing through projecting portions 71 to 73 of the pattern 61 at the time of exposure is likely to be leaked in regions each defined between adjacent ones of the patterns 40 in the row direction as transferred to the photoresist. Thus, the shape of the outermost ones of the patterns 40 as transferred to the photoresist cannot be formed sufficiently close to a desired shape.

The photomask 80 used in the method according to the present embodiment includes the dummy patterns 51 provided between the patterns 61a and the most adjacent ones of the patterns 40 aligned in the column direction at the pitch P1 from both the patterns. This allows the periodicity of the patterns 40 to be maintained in the row direction. Further, irradiated light passing through the patterns 61a at the time of exposure is unlikely to be leaked in regions each defined between adjacent ones of the patterns 40 in the column direction as transferred to the photoresist.

Further, in the present embodiment, the dummy patterns 50 are provided between the patterns 61b and the most adjacent ones of the patterns 40 aligned in the row direction at the pitch P2 from both the patterns. Thus, the periodicity of the patterns 40 is maintained in the column direction, and further, irradiated light passing through the patterns 61b at the time of exposure is unlikely to be leaked in regions each defined between adjacent ones of the patterns 40 in the row direction as transferred to the photoresist.

As described, in the present embodiment, irradiated light passing through the pattern 61 at the time of exposure is unlikely to be leaked in the regions each defined between adjacent ones of the patterns 40 as transferred to the photoresist while maintaining the periodicity of the patterns 40 in the column and row directions, which allows the outermost ones of the openings 10 to be formed closer to a desired shape than in the case of using the photomask 60 shown in FIG. 20 or 22. This results in improved reliability of the semiconductor memory.

Furthermore, the dummy patterns 51 and 53 provided at the pitch P1 from the patterns 61a allow the trenches 20a to be formed closer to a desired shape than in the second preferred embodiment. Similarly, the dummy patterns 50 and 52 provided at the pitch P2 from the patterns 61b allow the trenches 20b to be formed closer to a desired shape than in the second preferred embodiment.

Figure 25:
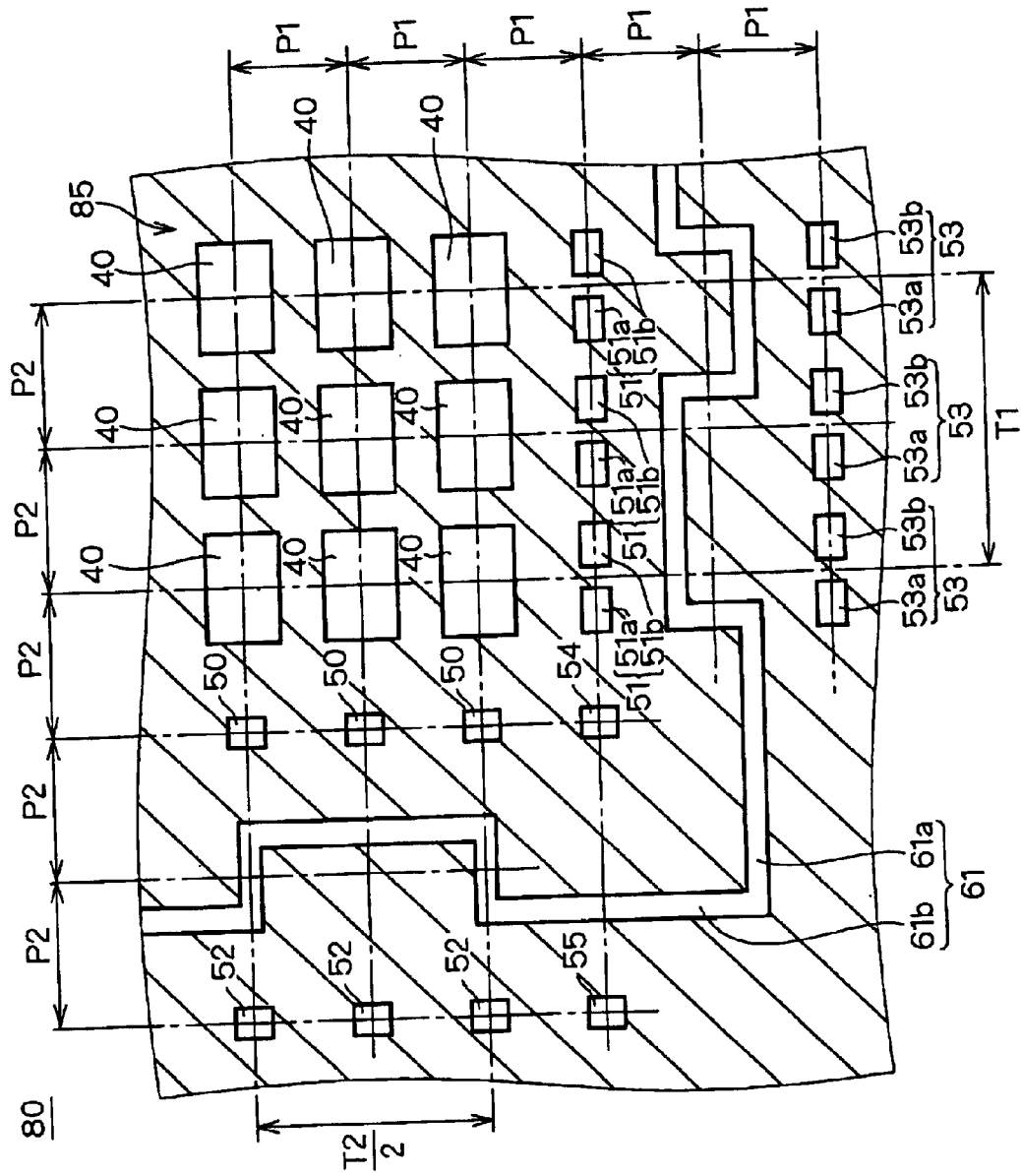
FIG. 25 is a plan view showing the photomask used in the method of manufacturing the semiconductor memory according to the third preferred embodiment.
Figure 26:
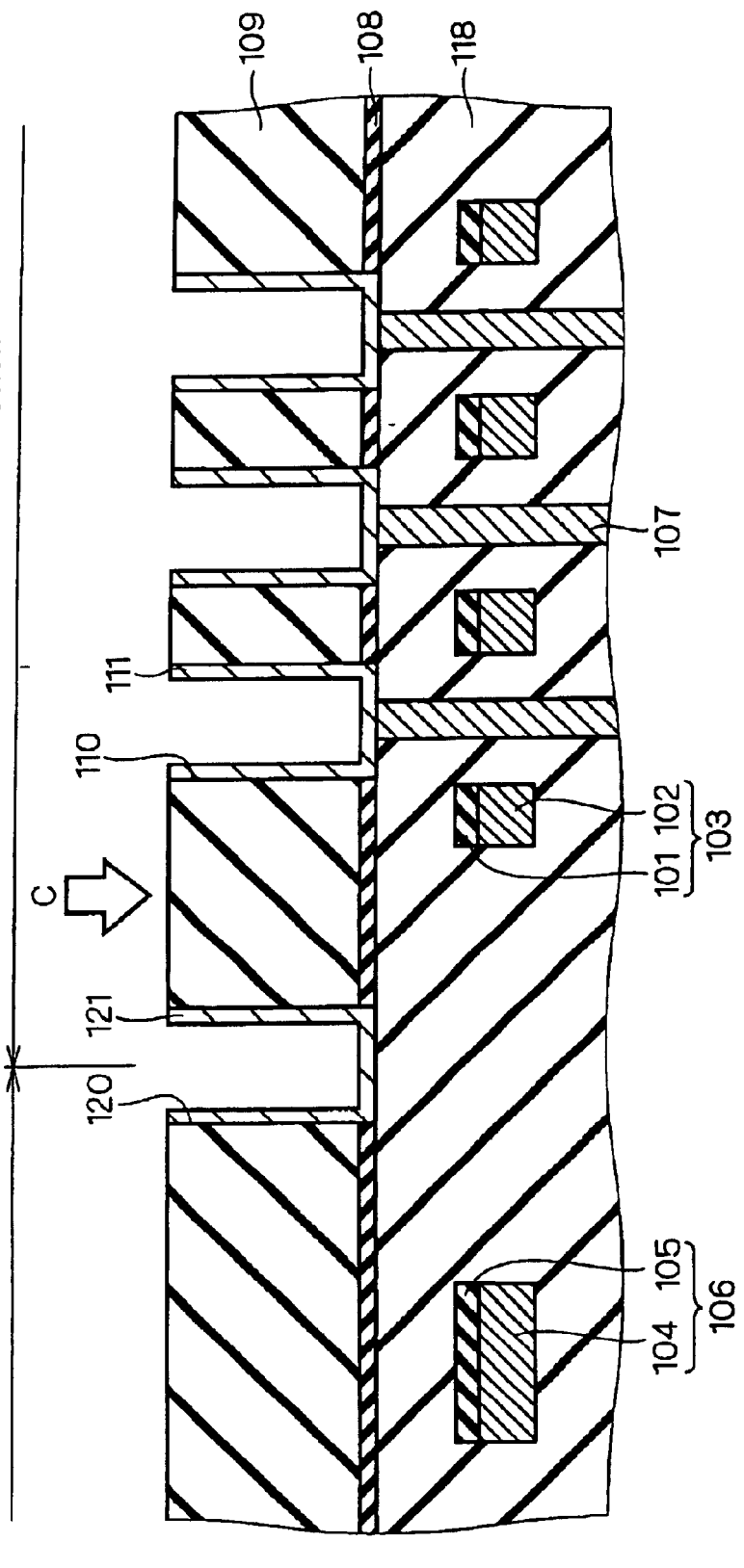
FIG. 26 is a sectional view showing a method of manufacturing a conventional semiconductor memory in sequential order.
Figure 27:
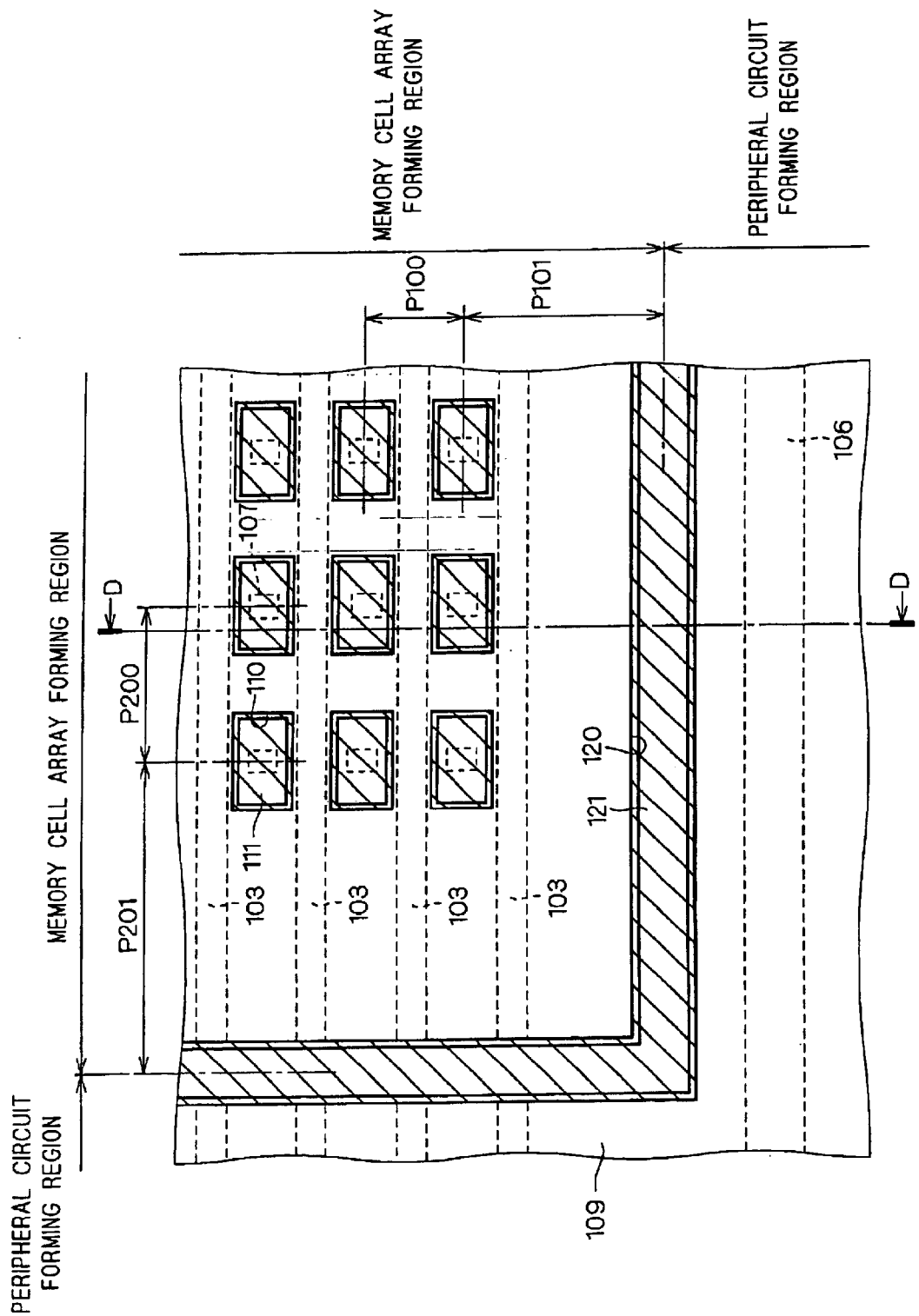
FIG. 27 is a plan view showing the structure of the conventional semiconductor memory.

Still further, as shown in FIG. 25, the meandering cycles of the patterns 61a and 61b may be doubled to make it easier to form the meandering trench 20 in the insulation layer 9.

While the invention has been shown and described in detail, the foregoing description is in all aspects illustrative and not restrictive. It is therefore understood that numerous modifications and variations can be devised without departing from the scope of the invention.

What is claimed is:

1. A method of manufacturing a semiconductor memory comprising a memory cell array forming region and a peripheral circuit forming region adjacent to said memory cell array forming region, said method comprising the steps of:

(a) forming an insulation layer in said memory cell array forming region and said peripheral circuit forming region;

(b) forming a plurality of openings in said insulation layer in said memory cell array forming region and forming a trench in said insulation layer at a border between said memory cell array forming region and said peripheral circuit forming region;

(c) forming a lower electrode of a capacitor on a surface of each of said plurality of openings;

(d) after said step (c), filling said trench with a resist and forming said resist on said insulation layer in said peripheral circuit forming region; and (e) selectively etching said insulation layer using said resist as a mask, wherein said step (b) includes the steps of:

(b-1) preparing a photomask provided with a mask pattern including a plurality of first patterns corresponding to said plurality of openings, arranged at a predetermined pitch, a first dummy pattern aligned linearly with said plurality of first patterns at said predetermined pitch from the most adjacent one of said plurality of first patterns, and a second pattern corresponding to said trench;

(b-2) forming a photoresist on said insulation layer;

(b-3) exposing said photoresist using said photomask to transfer said mask pattern to said photoresist;

(b-4) developing said photoresist, after said step (b-3); and (b-5) etching said insulation layer using said photoresist as a mask to form said plurality of openings and said trench, after said step (b-4), and said first dummy pattern is not transferred to said photoresist in said step (b-3).

2. The method according to claim 1, wherein said second pattern meanders.

3. The method according to claim 1, wherein said second pattern extends in a direction perpendicular to an arrangement direction of said plurality of first patterns, and said first dummy pattern is provided between said plurality of first patterns and said second pattern at said predetermined pitch from a central axis of said second pattern extending in said direction perpendicular to said arrangement direction of said plurality of first patterns.

4. The method according to claim 3, wherein said mask pattern further includes a second dummy pattern provided on an opposite side of said first dummy pattern with respect to said second pattern at said predetermined pitch from said central axis of said second pattern extending in said direction perpendicular to said arrangement direction of said plurality of first patterns, and said second dummy pattern is not transferred to said photoresist in said step (b-3).

5. The method according to claim 1, wherein said plurality of first patterns are arranged in a matrix at a first pitch in a column direction and at a second pitch in a row direction, said first dummy pattern includes:

a plurality of second dummy patterns, each being provided for and aligned linearly with each column of said plurality of first patterns at said first pitch from the most adjacent one of said plurality of first patterns; and a plurality of third dummy patterns, each being provided for and aligned linearly with each row of said plurality of first patterns at said second pitch from the most adjacent one of said plurality of first patterns.

6. The method according to claim 5, wherein said second pattern includes a third pattern extending in said row direction and a fourth pattern connected with said third pattern, extending in said column direction, said plurality of second dummy patterns are provided between said plurality of first patterns and said third pattern at said first pitch from a central axis of said third pattern extending in said row direction, and said plurality of third dummy patterns are provided between said plurality of first patterns and said fourth pattern at said second pitch from a central axis of said fourth pattern extending in said column direction.

7. The method according to claim 6, wherein said mask pattern further includes:

a fourth dummy pattern provided on an opposite side of said plurality of second dummy patterns with respect to said third pattern at said first pitch from a central axis of said third pattern extending in said row direction; and a fifth dummy pattern provided on an opposite side of said plurality of third dummy patterns with respect to said fourth pattern at said second pitch from a central axis of said fourth pattern extending in said column direction, and said fourth and fifth dummy patterns are not transferred to said photoresist in said step (b-3).

8. A method of manufacturing a semiconductor memory comprising a memory cell array forming region and a peripheral circuit forming region adjacent to said memory cell array forming region, said method comprising the steps of:

(a) forming an insulation layer in said memory cell array forming region and said peripheral circuit forming region;

(b) forming a plurality of openings in said insulation layer in said memory cell array forming region and forming a trench in said insulation layer at a border between said memory cell array forming region and said peripheral circuit forming region;

(c) forming a lower electrode of a capacitor on a surface of each of said plurality of openings and forming a guard ring film on a surface of said trench;

(d) after said step (c), forming a resist on said insulation layer in said peripheral circuit forming region; and (e) selectively etching said insulation layer using said resist as a mask, wherein said step (b) includes the steps of:

(b-1) preparing a photomask provided with a mask pattern including a plurality of first patterns corresponding to said plurality of openings, arranged at a predetermined pitch, a first dummy pattern aligned linearly with said plurality of first patterns at said predetermined pitch from the most adjacent one of said plurality of first patterns and a second pattern corresponding to said trench;

(b-2) forming a photoresist on said insulation layer;

(b-3) exposing said photoresist using said photomask to transfer said mask pattern to said photoresist;

(b-4) developing said photoresist, after said step (b-3); and (b-5) etching said insulation layer using said photoresist as a mask to form said plurality of openings and said trench, after said step (b-4), and said first dummy pattern is not transferred to said photoresist in said step (b-3).

9. The method according to claim 8, wherein said second pattern meanders.

10. The method according to claim 8, wherein said second pattern extends in a direction perpendicular to an arrangement direction of said plurality of first patterns, and said first dummy pattern is provided between said plurality of first patterns and said second pattern at said predetermined pitch from a central axis of said second pattern extending in said direction perpendicular to said arrangement direction of said plurality of first patterns.

11. The method according to claim 10, wherein
said mask pattern further includes a second dummy pattern provided on an opposite side of said first dummy pattern with respect to said second pattern at said predetermined pitch from said central axis of said second pattern extending in said direction perpendicular to said arrangement direction of said plurality of first patterns, and
said second dummy pattern is not transferred to said photoresist in said step (b-3).

12. The method according to claim 8, wherein
said plurality of first patterns are arranged in a matrix at a first pitch in a column direction and at a second pitch in a row direction,
said first dummy pattern includes:
  a plurality of second dummy patterns, each being provided for and aligned linearly with each column of said plurality of first patterns at said first pitch from the most adjacent one of said plurality of first patterns aligned in said column direction; and
  a plurality of third dummy patterns, each being provided for and aligned linearly with each row of said plurality of first patterns at said second pitch from the most adjacent one of said plurality of first patterns aligned in said row direction.

13. The method according to claim 12, wherein
said second pattern includes a third pattern extending in said row direction and a fourth pattern connected with said third pattern, extending in said column direction, said plurality of second dummy patterns are each provided between said plurality of first patterns and said third pattern at said first pitch from a central axis of said third pattern extending in said row direction, and
said plurality of third dummy patterns are each provided between said plurality of first patterns and said fourth pattern at said second pitch from a central axis of said fourth pattern extending in said column direction.

14. The method according to claim 13, wherein
said mask pattern further includes:
  a fourth dummy pattern provided on an opposite side of said plurality of second dummy patterns with respect to said third pattern at said first pitch from said central axis of said third pattern extending in said row direction; and
  a fifth dummy pattern provided on an opposite side of said plurality of third dummy patterns with respect to said fourth pattern at said second pitch from said central axis of said fourth pattern extending in said column direction, and
  said fourth and fifth dummy patterns are not transferred to said photoresist in said step (b-3).

15. A method of manufacturing a semiconductor memory comprising a memory cell array forming region and a peripheral circuit forming region adjacent to said memory cell array forming region, said method comprising the steps of:
  (a) forming an insulation layer in said memory cell array forming region and said peripheral circuit forming region;
  (b) forming an opening in said insulation layer in said memory cell array forming region and forming a meandering trench in said insulation layer at a border between said memory cell array forming region and said peripheral circuit forming region;
  (c) forming a lower electrode of a capacitor on a surface of said opening and forming a guard ring film on a surface of said trench;
  (d) after said step (c), forming a resist on said insulation layer in said peripheral circuit forming region; and
  (e) selectively etching said insulation layer using said resist as a mask.

16. The method according to claim 15, wherein
said opening formed in said step (b) includes a plurality of openings,
said step (b) includes the steps of:
  (b-1) preparing a photomask provided with a mask pattern including a plurality of first patterns corresponding to said plurality of openings, arranged at a predetermined pitch, and a second pattern corresponding to said trench, meandering in an arrangement direction of said plurality of first patterns;
  (b-2) forming a photoresist on said insulation layer;
  (b-3) exposing said photoresist using said photomask to transfer said mask pattern to said photoresist;
  (b-4) developing said photoresist, after said step (b-3); and
  (b-5) etching said insulation layer using said photoresist as a mask to form said plurality of openings and said trench, after said step (b-4),
said second pattern meanders in a cycle corresponding to said predetermined pitch, and
in a direction perpendicular to said arrangement direction of said plurality of first patterns, said second pattern has projecting portions closer to said plurality of first patterns, aligned linearly with said plurality of first patterns and projecting portions away from said plurality of first patterns, each being positioned on the extension of a region between adjacent ones of said plurality of first patterns.

17. The method according to claim 15, wherein
said opening formed in said step (b) includes a plurality of openings,
said step (b) includes the steps of:
  (b-1) preparing a photomask provided with a mask pattern including a plurality of first patterns corresponding to said plurality of openings, arranged at a predetermined pitch, and a second pattern corresponding to said trench, meandering in a direction perpendicular to an arrangement direction of said plurality of first patterns;
  (b-2) forming a photoresist on said insulation layer;
  (b-3) exposing said photoresist using said photomask to transfer said mask pattern to said photoresist;
  (b-4) developing said photoresist, after said step (b-3); and
  (b-5) etching said insulation layer using said photoresist as a mask to form said plurality of openings and said trench, after said step (b-4), and
said second pattern has a central axis spaced at said predetermined pitch from the most adjacent one of said plurality of first patterns, said central axis extending in said direction perpendicular to said arrangement direction of said plurality of first patterns.

18. The method according to claim 16, wherein
said plurality of first patterns are arranged in a matrix at a first pitch in a column direction and at a second pitch in a row direction,
said second pattern includes a third pattern meandering in said row direction and a fourth pattern connected with said third pattern, meandering in said column direction, said third pattern meanders in a cycle corresponding to said second pitch, in said column direction, said third pattern has projecting portions closer to said plurality of first patterns, aligned linearly with said plurality of first patterns and projecting portions away from said plurality of first patterns, each being positioned on the extension of a region between adjacent ones of said plurality of first patterns in said row direction, said fourth pattern meanders in a cycle corresponding to said first pitch, in said row direction, said fourth pattern has projecting portions closer to said plurality of first patterns, aligned linearly with said plurality of first patterns and projecting portions away from said plurality of first patterns, each being positioned on the extension of a region between adjacent ones of said plurality of first patterns in said column direction.

19. The method according to claim 17, wherein said plurality of first patterns are arranged in a matrix at a first pitch in a column direction and at a second pitch in a row direction, said second pattern includes a third pattern meandering in said row direction and a fourth pattern connected with said third pattern, meandering in said column direction, said third pattern has a central axis extending in said row direction spaced at said first pitch from the most adjacent ones of said plurality of first patterns aligned in said row direction, and said fourth pattern has a central axis extending in said column direction spaced at said second pitch from the most adjacent ones of said plurality of first patterns aligned in said column direction.

20. The method according to claim 15, wherein said opening formed in said step (b) includes a plurality of openings, said step (b) includes the steps of:
- (b-1) preparing a photomask provided with a mask pattern including a plurality of first patterns corresponding to said plurality of openings, arranged at a predetermined pitch, and a second pattern corresponding to said trench;
- (b-2) forming a photoresist on said insulation layer;
- (b-3) exposing said photoresist using said photomask to transfer said mask pattern to said photoresist;
- (b-4) developing said photoresist, after said step (b-3); and
- (b-5) etching said insulation layer using said photoresist as a mask to form said plurality of openings and said trench, after said step (b-4), said second pattern includes a third pattern meandering in an arrangement direction of said plurality of first patterns and a fourth pattern connected with said third pattern, meandering in a direction perpendicular to said arrangement direction of said plurality of first patterns, said third pattern meanders in a cycle corresponding to said predetermined pitch, in said direction perpendicular to said arrangement direction of said plurality of first patterns, said third pattern has projecting portions closer to said plurality of first patterns, aligned linearly with said plurality of first patterns and projecting portions away from said plurality of first patterns, each being positioned on the extension of a region between adjacent ones of said plurality of first patterns, and said fourth pattern has a central axis spaced at said predetermined pitch from the most adjacent one of said plurality of first patterns, said central axis extending in said direction perpendicular to said arrangement direction of said plurality of first patterns.

* * * * *